(12) United States Patent
Clevenger et al.

(10) Patent No.: US 8,952,539 B2
(45) Date of Patent: Feb. 10, 2015

(54) METHODS FOR FABRICATION OF AN AIR GAP-CONTAINING INTERCONNECT STRUCTURE

(71) Applicant: International Business Machines Corporation, Armonk, NY (US)

(72) Inventors: Lawrence A. Clevenger, LaGrangeville, NY (US); Maxime Darnon, White Plains, NY (US); Satyanarayana V. Nitta, Poughquag, NY (US); Anthony D. Lisi, Hopewell Junction, NY (US); Qinghuang Lin, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/157,098

(22) Filed: Jan. 16, 2014

(65) Prior Publication Data

US 2014/0131880 A1 May 15, 2014

Related U.S. Application Data

(62) Division of application No. 12/721,032, filed on Mar. 10, 2010, now Pat. No. 8,642,252.

(51) Int. Cl.
*H01L 23/538* (2006.01)
*H01L 23/482* (2006.01)
(Continued)

(52) U.S. Cl.
CPC ...... *H01L 23/4821* (2013.01); *H01L 21/02126* (2013.01); *H01L 21/02274* (2013.01);
(Continued)

(58) Field of Classification Search
USPC .......... 257/773, 734, E23.169, E21.576, 522, 257/508, 758, 640; 438/624, 622, 618, 619
See application file for complete search history.

(56) References Cited

U.S. PATENT DOCUMENTS

| 4,371,605 A | 2/1983 | Renner |
| 5,886,102 A | 3/1999 | Sinta et al. |

(Continued)

FOREIGN PATENT DOCUMENTS

| CA | 1204547 | 5/1986 |
| JP | 01293339 | 11/1989 |

OTHER PUBLICATIONS

Owe-Yang, D.C., et al., "Double exposure for the contact layer of the 65-nm node", Proc. SPIE, 2005, Adv. Resist Technology and Processing, vol. 5753, pp. 171-180.

*Primary Examiner* — S. V. Clark
*Assistant Examiner* — Krista Soderholm
(74) *Attorney, Agent, or Firm* — Scully, Scott, Murphy & Presser, P.C.; Lous J. Percello, Esq.

(57) ABSTRACT

Methods for producing air gap-containing metal-insulator interconnect structures for VLSI and ULSI devices using a photo-patternable low k material as well as the air gap-containing interconnect structure that is formed are disclosed. More particularly, the methods described herein provide interconnect structures built in a photo-patternable low k material in which air gaps are defined by photolithography in the photo-patternable low k material. In the methods of the present invention, no etch step is required to form the air gaps. Since no etch step is required in forming the air gaps within the photo-patternable low k material, the methods disclosed in this invention provide highly reliable interconnect structures.

15 Claims, 7 Drawing Sheets

(51) Int. Cl.
  *H01L 21/02* (2006.01)
  *H01L 21/31* (2006.01)
  *H01L 21/3105* (2006.01)
  *H01L 21/768* (2006.01)
  *H01L 23/522* (2006.01)
  *H01L 23/532* (2006.01)
  *C08L 83/04* (2006.01)

(52) U.S. Cl.
  CPC .... *H01L21/02282* (2013.01); *H01L 21/02318* (2013.01); *H01L 21/31* (2013.01); *H01L 21/3105* (2013.01); *H01L 21/76807* (2013.01); *H01L 21/76808* (2013.01); *H01L 21/7682* (2013.01); *H01L 23/5222* (2013.01); *H01L 23/53295* (2013.01); *C08L 83/04* (2013.01); *H01L 23/53223* (2013.01); *H01L 23/53238* (2013.01); *H01L 2221/1031* (2013.01); *H01L 2924/12044* (2013.01)
  USPC .... 257/773; 257/640; 257/758; 257/E23.169; 257/734; 438/619; 438/622

(56) References Cited

U.S. PATENT DOCUMENTS

| | | | |
|---|---|---|---|
| 5,939,236 A | 8/1999 | Pavelchek et al. | |
| 6,025,260 A | 2/2000 | Lien et al. | |
| 6,087,064 A | 7/2000 | Lin et al. | |
| 6,211,561 B1* | 4/2001 | Zhao | 257/522 |
| 6,214,719 B1 | 4/2001 | Nag | |
| 6,455,416 B1 | 9/2002 | Subramanian et al. | |
| 6,492,256 B2 | 12/2002 | Lee et al. | |
| 6,492,732 B2 | 12/2002 | Lee et al. | |
| 6,514,667 B2 | 2/2003 | Angelopoulos et al. | |
| 6,566,019 B2 | 5/2003 | Kling et al. | |
| 6,780,753 B2 | 8/2004 | Latchford et al. | |
| 6,787,469 B2 | 9/2004 | Houston et al. | |
| 6,805,109 B2 | 10/2004 | Cowan | |
| 6,861,180 B2 | 3/2005 | Chang | |
| 6,861,367 B2 | 3/2005 | Gilton et al. | |
| 7,041,748 B2 | 5/2006 | Lin et al. | |
| 7,056,822 B1 | 6/2006 | Zhao | |
| 7,056,840 B2 | 6/2006 | Miller et al. | |
| 7,064,078 B2 | 6/2006 | Liu et al. | |
| 7,071,532 B2 | 7/2006 | Geffken et al. | |
| 7,091,611 B2 | 8/2006 | Ahn et al. | |
| 7,138,329 B2 | 11/2006 | Lur et al. | |
| 7,253,095 B2* | 8/2007 | Lur et al. | 438/619 |
| 7,306,853 B2 | 12/2007 | Lin et al. | |
| 7,709,370 B2 | 5/2010 | Allen et al. | |
| 8,202,783 B2 | 6/2012 | Lin et al. | |
| 2001/0016412 A1 | 8/2001 | Lee et al. | |
| 2002/0163082 A1 | 11/2002 | Lee et al. | |
| 2003/0073028 A1 | 4/2003 | Kim et al. | |
| 2003/0129531 A1 | 7/2003 | Oberlander et al. | |
| 2003/0198877 A1 | 10/2003 | Pfeiffer et al. | |
| 2004/0048194 A1 | 3/2004 | Breyta et al. | |
| 2004/0094821 A1 | 5/2004 | Lur et al. | |
| 2004/0151489 A1 | 8/2004 | Zhou | |
| 2005/0093158 A1 | 5/2005 | Liu et al. | |
| 2005/0263896 A1 | 12/2005 | Lur et al. | |
| 2006/0228895 A1 | 10/2006 | Chae et al. | |
| 2007/0003841 A1 | 1/2007 | Choi | |
| 2007/0020565 A1 | 1/2007 | Koh et al. | |
| 2007/0054198 A1 | 3/2007 | Park | |
| 2007/0148968 A1 | 6/2007 | Kwon et al. | |
| 2007/0212649 A1 | 9/2007 | Lalbahadoersing et al. | |
| 2007/0248899 A1 | 10/2007 | Choi | |
| 2008/0038934 A1 | 2/2008 | Vrtis et al. | |
| 2008/0150091 A1 | 6/2008 | Lin | |
| 2008/0173984 A1 | 7/2008 | Lin et al. | |
| 2008/0286467 A1 | 11/2008 | Allen et al. | |
| 2009/0079075 A1 | 3/2009 | Lin et al. | |
| 2009/0079076 A1 | 3/2009 | Lin et al. | |
| 2009/0081418 A1 | 3/2009 | Allen et al. | |
| 2009/0115019 A1* | 5/2009 | Lee et al. | 257/522 |
| 2009/0174067 A1* | 7/2009 | Lin | 257/734 |
| 2009/0233226 A1 | 9/2009 | Allen et al. | |
| 2009/0291389 A1 | 11/2009 | Allen et al. | |

* cited by examiner

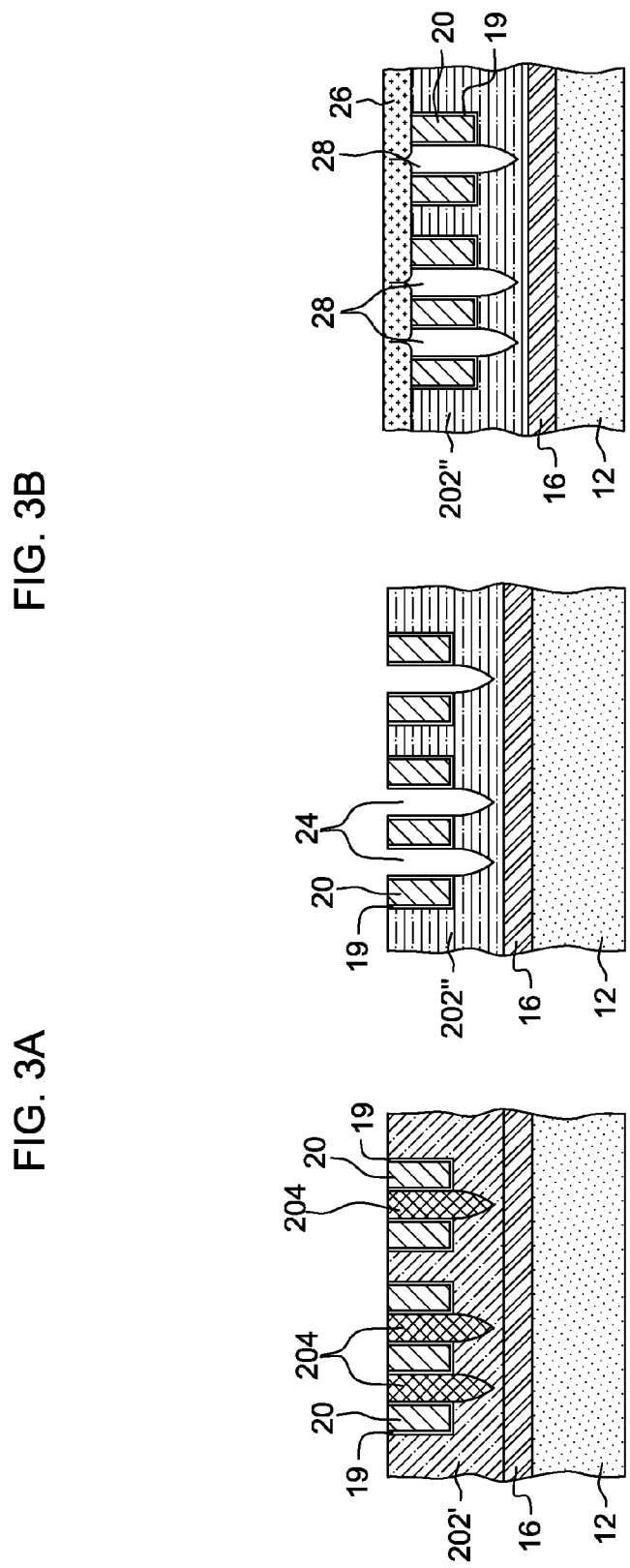

METHODS FOR FABRICATION OF AN AIR GAP-CONTAINING INTERCONNECT STRUCTURE

CROSS REFERENCE TO RELATED APPLICATION

This application is a divisional of U.S. patent application Ser. No. 12/721,032, filed Mar. 10, 2010 the entire content and disclosure of which is incorporated herein by reference.

FIELD OF THE INVENTION

The present invention relates to air gap-containing metal insulator interconnect structures for Very Large Scale Integrated (VLSI) and Ultra-Large Scale Integrated (ULSI) devices and methods of forming the same.

BACKGROUND OF THE INVENTION

Interconnect structures in integrated circuits induce a delay in the propagation of the information between semiconductor devices such as transistors. To reduce this delay, the interconnect structures should posses the lowest capacitance possible. One approach to form interconnect structures with the lowest possible capacitance is to introduce air (or vacuum) gaps into the interconnect dielectric material of the interconnect structure; by replacing a portion of the dielectric material with an air gap, the capacitance can be reduced dramatically.

Among several integration schemes proposed for air gap integration, a dielectric etch back scheme is the most commonly used. See, for example, Arnal et al. 2001 Proc. IEEE International Interconnect Technology Conference, pages 298-300. In this scheme, the gap is etched in a dielectric cap between two metal lines, and eventually transferred into the dielectric material. After transferring the gap into the dielectric material, the dielectric material is isotropically removed between the two metal lines. A dielectric deposition process is then performed that pinches off the gap such that the next interconnect level can be fabricated.

There are several problems with the aforementioned prior art air gap fabrication scheme. First, the above mentioned prior art air gap fabrication scheme requires a very accurate lithographic step to define trenches between the metal lines. Furthermore, the above mentioned prior art scheme requires an etch step to remove the dielectric in between the metal lines. If the lithography step is not perfect (misaligned, or too large an opening may result) and, if the etch step leads to a width increase, the metal lines can be damaged by this etch step. The isotropic etch process may also damage the sidewalls of the metal line or the interface between the metal lines and an overlying cap layer. Both issues may lead to reliability issues.

Finally, the need for very high resolution lithography and a critical etch step lead to a huge increase in the cost of the air gap module. Thus, there is a need for a simplified integration scheme that leads to cheap and reliable air gap-containing interconnect structures.

SUMMARY OF THE INVENTION

The present invention relates to methods for producing air gap-containing metal-insulator interconnect structures for VLSI and ULSI devices using a photo-patternable low k (PPLK) material as well as the air gap-containing interconnect structure that is formed. More particularly, the methods described herein provide interconnect structures built in a photo-patternable low k material in which air gaps are defined by photolithography in the photo-patternable low k material. In the methods of the present invention, no etch step is required to form the air gaps. Since no etch step is required in forming the air gaps within the photo-patternable low k material, the methods disclosed in this invention provide highly reliable interconnect structures.

In one aspect of the invention, an interconnect structure is provided that includes at least one air gap within a cured photo-patternable low k (PPLK) material. Specifically, the interconnect structure includes a cured photo-patternable low k (PPLK) material located atop a substrate. The cured PPLK material includes a plurality of conductively filled openings located therein. At least one air gap is located within the cured PPLK material between preselected neighboring conductively filled openings. A dielectric cap is located atop the cured PPLK material as well as atop the at least one air gap.

In another aspect of the invention, various methods are provided for forming the aforementioned air gap-containing interconnect structure. In general terms, the various methods can be characterized as including step of: providing a photo-patternable low k (PPLK) material atop a substrate; forming at least one gap within said PPLK material; curing the PPLK material; and forming a dielectric cap atop the cured PPLK material and atop the at least one gap forming at least one air gap within the cured PPLK material.

In one embodiment of the invention, a plurality of conductively filled openings is formed within the PPLK material prior to forming the at least one gap. In another embodiment of the invention, a plurality of conductively filled openings is formed within the PPLK material after forming the at least one gap.

BRIEF DESCRIPTION OF THE DRAWINGS

FIGS. 3A-3E are pictorial representations (through cross sectional views) depicting the basic processing steps employed in a third embodiment of the invention which can be referred to herein as a gap first positive-tone PPLK scheme.

DETAILED DESCRIPTION OF THE INVENTION

Figure 1A:
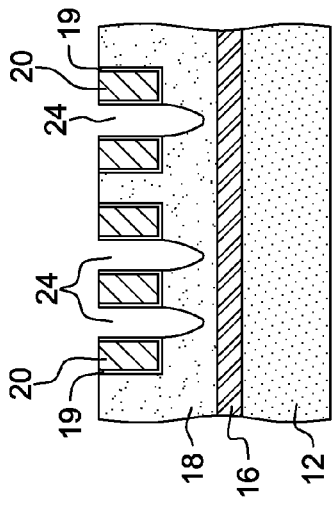
FIGS. 1A-1E are pictorial representations (through cross sectional views) depicting the basic processing steps employed in a first embodiment of the invention which can be referred to herein as a metal first positive-tone PPLK scheme.

The present invention, which provides methods of forming air gap-containing interconnect structures using a PPLK material and photolithography as well as the air gap-containing interconnect structures prepared by the methods, will now be described in greater detail by referring to the following discussion and drawings that accompany the present application. It is observed that the drawings of the present application are provided for illustrative proposes and, as such, the drawings are not drawn to scale.

In the following description, numerous specific details are set forth, such as particular structures, components, materials, dimensions, processing steps and techniques, in order to provide an understanding of some aspects of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, methods for producing air gap-containing metal-insulator interconnect structures for VLSI and ULSI devices using a photo-patternable low k (PPLK) material are disclosed. More particularly, the methods disclosed herein provide interconnect structures including a photo-patternable low k material in which air gaps are defined by photolithography in the photo-patternable low k material. With such methods, no etch step is needed to form the air gaps.

It is noted that the patternable low-k materials employed in the invention are any dielectric materials possessing two functions. They act as a photoresist during a patterning process and are subsequently converted into a low-k dielectric insulator during a post patterning cure process. The cured product of a patternable low-k material, therefore, can serve as an on-chip dielectric insulator. The patternable low-k material can be deposited from a liquid phase. In the present invention, the terms "cure" or "curing" are used interchangeable to refer one of the processes selected from a thermal cure, an electron beam cure, an ultra-violet (UV) cure, an ion beam cure, a plasma cure, a microwave cure or a combination thereof. A "cured" product of a patternable low-k material is the product of the patternable low-k material after it has undergone one of the aforementioned cure processes. The "cured" product of a patternable low-k material is different from the patternable low-k material in chemical nature and physical, mechanical and electrical properties.

The term "photo-patternable low k material (or PPLK for short)" includes a functionalized polymer, copolymer or blend including at least two of any combination of polymers and/or copolymers having one or more acid-sensitive imageable groups. The PPLK material acts as a photoresist and after curing it is converted into a dielectric material having a dielectric constant of about 4.3 or less. It is noted that when the PPLK material is comprised of a polymer, the polymer includes at least one monomer (to be described in greater detail below). When the PPLK material is comprised of a copolymer, the copolymer includes at least two monomers (to be described in greater detail below). The blends of polymers and/or copolymers include at least two of any combination of polymers and/or copolymers described below.

In general terms, the PPLK material that can be employed is a patternable composition including a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

More specifically, the PPLK material that can be employed is a patternable composition comprising a photo/acid-sensitive polymer of one monomer or a copolymer of at least two monomers selected from siloxane, silane, carbosilane, oxycarbosilane, organosilicates, silsesquioxanes and the like. The PPLK material may also be patternable composition comprising a polymer of one monomer or a copolymer of at least two monomers selected from alkyltrialkoxysilane, tetraalkoxysilane, unsaturated alkyl (such as vinyl) substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane. Additionally, the PPLK material may comprise a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

Optionally the PPLK material may be patternable composition further comprising at least one microscopic pore generator (porogen). The pore generator may be or may not be photo/acid sensitive.

Illustrative polymers for the PPLK material include, but are not limited to siloxane, silane, carbosilane, oxycarbosilane, silsesquioxane-type polymers including caged, linear, branched or combinations thereof. In one embodiment, the PPLK material is a patternable composition comprising a blend of these photo/acid-sensitive polymers. Examples of PPLK materials that can be employed in this application are disclosed, for example, in U.S. Pat. Nos. 7,041,748, 7,056,840, and 6,087,064, as well as U.S. Patent Application Publication No. 2008/0286467, U.S. Patent Application Publication No. 2009/0233226, U.S. Patent Application Publication No. 2009/0291389, U.S. patent application Ser. No. 12/569,200, filed Sep. 29, 2009, now U.S. Pat. No. 8,202,783, all of which are incorporated herein by reference in their entirety.

The PPLK material is formed from a patternable composition (negative-tone or positive-tone) that includes at least one of the above mentioned polymers, copolymers or blends, a photoacid generator, a base additive and a solvent typically used in a photoresist composition. When the PPLK material is a negative-tone patternable material, it may be formed from a patternable composition optionally including an additional cross-linker. By "negative-tone" it is meant that the part of the PPLK material that is exposed to photolithography will not be removed by a conventional developer, while the unexposed part of the PPLK material is removed.

The additional cross-linker can be a small compound (as compared with a polymer or copolymer) or a polymer, a copolymer, or a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

When the PPLK material is a positive-tone patternable material, it is formed from a patternable composition that includes at least one of the above mentioned polymers, copolymers or blends, a photoacid generator, a base additive and a solvent typically used in a photoresists. By "positive-tone" it is meant that the part of the PPLK material that is exposed to photolithography will be removed by a conventional developer, while the unexposed part of the PPLK material is not removed. The photoacid generators, base additives and solvents are well known to those skilled in the art and, as such, details regarding those components are not fully provided.

The various methods of the present invention which include the use of the PPLK material described above will now described in greater detail. Reference is first made to FIGS. 1A-1E which illustrate a first embodiment of the present invention. The first embodiment of the present invention can be referred to as a metal first positive-tone PPLK scheme. In the first embodiment, a positive-tone PPLK material, as described above, is deposited on a substrate. The substrate can include an optional dielectric cap, an antireflective coating (ARC) or a multilayered stack thereof. Standard interconnect structures are built into the positive-tone PPLK material using standard single or dual damascene methods well known to those skilled in the art. The positive-tone PPLK material maintains its photosensitive property during the interconnect build up. A photolithography step is employed after the interconnect structure build up to define the air gap position in-between the metal lines. Since the metal lines are not sensitive to ultra violet radiation, the lithography requirements in terms of the dimension and alignment are relaxed. The positive-tone PPLK material exposed in the lithography step is removed by a conventional developer leaving gaps in-between the metal lines. After forming the gaps, the remaining PPLK material is cured forming a cured and patterned permanent low k dielectric including gaps in-between the metal lines. A dielectric cap is then formed atop the cured and permanent low k dielectric material sealing off the gaps forming an air gap-containing interconnect structure in which the air gaps are formed within the cured and patterned permanent low k dielectric material in-between the metal lines.

Reference is now made to FIG. 1A which illustrates an initial interconnect structure 10 that can be embodiment in this embodiment of the invention. The initial interconnect structure 10 of FIG. 1A includes a substrate 12, an optional ARC 16, a processed positive-tone PPLK material 18, and a plurality of metal lines 20 within the processed positive-tone PPLK material 18. In some embodiments of the invention, the optional ARC 16 is present either directly on a surface of an optional dielectric cap (not shown), if present, or directly on a surface of substrate 12, if the dielectric cap is not present. Although the ARC 16 is optional it is typically present in embodiments in which a PPLK material is formed directly on an upper surface thereof.

The substrate 12 may comprise a semiconducting material, an electrically insulating material, an electrically conductive material, devices or structures made of these materials or any combination thereof (e.g., a lower level of an interconnect structure). When the substrate 12 is comprised of a semiconducting material, any semiconductor such as Si, SiGe, SiGeC, SiC, Ge alloys, GaAs, InAs, InP and other III/V or II/VI compound semiconductors, or organic semiconductors may be used. The substrate 12 may also be a flexible substrate containing devices that are suitable for high-speed roll-to-roll processing. In addition to these listed types of semiconducting materials, substrate 12 may also be a layered semiconductor such as, for example, Si/SiGe, Si/SiC, silicon-on-insulators (SOIs) or silicon germanium-on-insulators (SGOIs). These semiconductor materials may form a device, or devices or structures, which may be discrete or interconnected. These devices and device structures may be for computation, transmission, storage or display of information, such as logic devices, memory devices, switches or display devices. In some embodiments, one or more semiconductor devices such as, for example, complementary metal oxide semiconductor (CMOS) devices, strained silicon devices, carbon-based (e.g., carbon nanotubes and/or graphene) devices, phase-change memory devices, magnetic memory devices, magnetic spin switching devices, single electron transistors, quantum devices, molecule-based switches and other switching or memory devices that can be part of an integrated circuit, can be fabricated on the semiconducting material.

When the substrate 12 is an electrically insulating material, the insulating material can be an organic insulator, an inorganic insulator or a combination thereof including multilayers. The substrate 12 can also include a photoresist that has been converted in a patterned dielectric material utilizing a photoresist conversion process. The electrically insulating materials may be part of a device, or devices or structures, which may be discrete or interconnected. These devices and structures may be for logic applications or memory applications.

When the substrate 12 is an electrically conducting material, the substrate may include, for example, polySi, an elemental metal, an alloy including at least one elemental metal, a metal silicide, a metal nitride or combinations thereof including multilayers.

When present, the optional dielectric cap is formed directly on the surface of substrate 12 utilizing a standard deposition process such as, for example, chemical vapor deposition (CVD), plasma enhanced chemical vapor deposition (PECVD), atomic layer deposition (ALD), chemical solution deposition, or evaporation. The optional dielectric cap comprises any suitable dielectric capping material such as, for example, SiC, SiN, $SiO_2$, a carbon doped oxide, a nitrogen and hydrogen doped silicon carbide SiC(N,H) or multilayers thereof. The optional dielectric cap can be a continuous layer or a discontinuous layer. The optional dielectric cap can be a layer with graded composition in the vertical direction. It can also be a select cap, such as CoWP.

A post deposition treatment may be applied to the optional dielectric cap to modify the properties of either the entire layer or the surface of the dielectric cap. This post deposition treatment can be selected from heat treatment, irradiation of electromagnetic wave (such of ultra-violet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise. The purpose of the post deposition treatment is to enhance the chemical, physical, electrical, and/or mechanical properties of the dielectric cap, such as adhesion strength. The chemical properties include the nature and/or location of surface functional groups, and hydrophilicity. The physical properties include density, moisture absorption, and heat conductivity. The mechanical properties include modulus, hardness, cohesive strength, toughness, resistance to crack and adhesion strength to its neighboring layers. The electrical properties include dielectric constant, electrical breakdown field, and leakage current.

The heat treatment should be no higher than the temperature that the underlying substrate can withstand, usually 500° C. This heat treatment can be conducted in an inert environment or within a chemical environment in a gas phase or a liquid phase. This treatment step may or may not be performed in the same tool as that used in forming the optional dielectric cap.

The post deposition treatment by irradiation of electromagnetic wave can be by ultra-violet (UV) light, microwave and the like. The UV light can be broadband with a wavelength range from 100 nm to 1000 nm. It can also be UV light generated by an excimer laser or other UV light source. The UV treatment dose can be a few $mJ/cm^2$ to thousands of $J/cm^2$. This irradiation treatment can be conducted at ambient temperature or at an elevated temperature no higher than 500° C. This irradiation treatment can be conducted in an inert environment or within a chemical environment in a gas phase or a liquid phase. The following conditions can be employed for this aspect of the present invention: a radiation time from 10 sec to 30 min, a temperature from room temperature to 500° C., and an environment including vacuum, or gases such as, for example, inert gas, $N_2$, $H_2$, $O_2$, $NH_3$, hydrocarbon, and $SiH_4$. This treatment step may or may not be performed in the same tool as that used in forming the optional dielectric cap.

The post deposition treatment by plasma treatment can be selected from an oxidizing plasma, a reducing plasma or a neutral plasma. Oxidizing plasmas include, for example, $O_2$, CO, and $CO_2$. Reducing plasmas include, for example, $H_2$, $N_2$, $NH_3$, and $SiH_4$. The neutral plasmas include, for example, Ar and He. A plasma treatment time from 1 sec to 10 min and a plasma treatment temperature from room temperature to 400° C. can be employed. This treatment step may or may not be performed in the same tool as that used in forming the optional dielectric cap.

The post deposition chemical treatment may be conducted in a gas phase or a liquid phase. The following conditions may be employed for this aspect of the present invention: a treatment time from 1 sec to 30 min, a temperature from room temperature (i.e., from 20° C. to 30° C.) to 500° C. Chemicals suitable for this chemical treatment may be selected from any chemicals that improve chemical, physical, electrical, and/or mechanical properties of the dielectric cap layer, such as adhesion strength. This chemical treatment may penetrate the entire optional dielectric cap or is limited only to the surface of the optional dielectric cap. Example chemicals include adhesion promoters such as silanes, siloxanes and silylation agents. This treatment step may or may not be performed in the same tool as that used in forming the optional dielectric cap.

The thickness of the optional dielectric cap, when present, may vary depending on the technique used to form the same as well as the material make-up of the layer. Typically, the dielectric cap has a thickness from 1 nm to 100 nm, with a thickness from 20 nm to 45 nm being more typical.

An optional antireflective coating (ARC) 16 can be formed on a surface of the optional dielectric cap if present, or directly on a surface of the substrate 12 when the dielectric cap is not present. Although, ARC 16 is optional, it is typically present when a PPLK material is formed directly on an upper surface thereof. The ARC 16 employed has all of the following general characteristics: (i) It acts as an ARC during a lithographic patterning process; (ii) It withstands high-temperature BEOL integration processing (up to 500° C.); (iii) It prevents photoresist, e.g., PPLK material, poisoning by the substrate; (iv) It provides vertical wall profile and sufficient etch selectivity between the photoresist, e.g., PPLK material, and the ARC layer; (v) It serves as a permanent dielectric layer in a chip (low dielectric constant, preferably k<5, more preferably k<3.6); and (vi) It is compatible with conventional BEOL integration and produces reliable hardware.

Further discussion is now provided for characteristics (i)-(v).

Characteristic (i) ARC 16 acts as an antireflective coating (ARC) during a lithographic patterning process: ARC 16 may be designed to control reflection of light that is transmitted through the photoresist, e.g., PPLK material, reflected off the substrate 12 and back into the photoresist, e.g., PPLK material, where it can interfere with incoming light and cause the photoresist, e.g., PPLK material, to be unevenly exposed. The ARC's optical constants are defined here as the index of refraction n and the extinction coefficient k. In general, ARC 16 can be modeled so as to find optimum optical parameters (n and k values) of the ARC as well as optimum thickness. The preferred optical constants of ARC 16 are in the range from n=1.2 to n=3.0 and k=0.01 to k=0.9, preferably n=1.4 to n=2.6 and k=0.02 to k=0.78 at a wavelength of 365, 248, 193 and 157, 126 nm and extreme ultraviolet (13.4 nm) radiation. The optical properties and thickness of ARC 16 are optimized to obtain optimal resolution, profile control and to maximize the process window of the photoresist, e.g., PPLK material, during the subsequent patterning steps, which is well known to those ordinarily skilled in the art.

Characteristic (ii) ARC 16 can withstand high-temperature BEOL integration processing (up to 500° C.): ARC 16 must withstand the harsh processing conditions during BEOL integration. These include high temperature and intense UV cure. The process temperature can be as high as 450° C. The intensity of the light used in the UV cure process can be as high as tens of $J/cm^2$.

Characteristic (iii) ARC 16 prevents photoresist, e.g., PPLK material, poisoning by the substrate: The photoresist, e.g., PPLK material, employed herein are preferably chemically amplified resists. They can be poisoned by any basic containment from the underlying substrate, such as a SiCN cap layer. ARC 16 must serve as a barrier layer to prevent basic contaminant from the underlying substrate from diffusing into the photoresist, e.g., PPLK material, to poison the chemically amplified photoresist.

Characteristic (iv) ARC 16 provides vertical wall profile and sufficient etch selectivity between the photoresist, e.g., PPLK material, and the ARC layer: ARC 16 should provide sufficient reflectivity control with reflectivity from the underlying substrate under a particular lithographic wavelength of less than 8%, preferably less than 5%, more preferably less than 2% and generate vertical side wafer profile. ARC 16 should also generate residue-free patterns with no footing. Moreover, the adhesion of the photoresist, e.g., PPLK material, should be sufficient to prevent pattern collapse during patterning and the subsequent UV cure. ARC 16 should also be designed such that the etch selectivity during a subsequent ARC/cap open process is sufficiently high so that the opening of the ARC/cap stack does not erode a significant portion of the photoresist, e.g., PPLK material, and degrade significantly its pattern profile. An etch selectivity (etch rate ratio of ARC/cap versus photoresist, e.g., PPLK material) is greater than 1, preferably greater than 3, more preferable greater than 5.

Characteristic (v) ARC 16 serves as a permanent dielectric layer in a chip: ARC 16 remains after patterning and cure of the photoresist. It serves as a permanent dielectric layer in a chip. Therefore, ARC 16 (after cure) must meet the requirements of an on-chip dielectric insulator, including electrical properties (low dielectric constant: preferably k less than 5, and more preferably k less than 3.6; dielectric breakdown field: greater than 2 MV/cm, preferably greater than 4 MV/cm, and more preferably greater than 6 MV/cm, leakage: less than $10^{-5}$ $A/cm^2$, preferably less than $10^{-7}$ $A/cm^2$, and more preferably less than $10^{-9}$ $A/cm^2$); mechanical properties (adhesion energy is equal to or greater than the cohesive energy of the weakest layer of the integrated film stack); must pass electrical and mechanical reliability tests.

The thickness of the ARC 16 may vary depending on the technique used to form the same as well as the material make-up of the layer. Typically, the ARC 16 has a thickness from 1 nm to 200 nm, with a thickness from 10 nm to 140 nm being more typical. The ARC 16 may be inorganic or a hybrid of inorganic and organic. ARC 16 may be a single layer or multilayer. It may also be a graded ARC with graded composition in the vertical direction.

Inorganic antireflective coatings, such as silicon oxynitride (SiON), silicon carbide (SiC), silicon oxycarbide (SiOC), SiCOH, siloxane, silane, carbosilane, oxycarbosilane, and silsesquioxane, either as a polymer or a copolymer may be employed as ARC 16 and may be deposited, for example, by plasma-enhanced chemical vapor deposition, spin-on techniques, spray coating, dip coating, etc. ARC 16 may be a single layer or multilayer. When ARC 16 is a multilayer ARC, the deposition of each layer may be the same or a combination of deposition methods can be used. The chemical composition of ARC 16 may be uniform or graded along the vertical direction. After applying ARC 16, particularly those from a liquid phase, a post deposition baking step is usually required to remove unwanted components, such as solvent, and to effect crosslinking. The post deposition baking step of ARC 16 is typically, but not necessarily always, performed at a temperature from 80° C. to 300° C., with a baking temperature from 120° C. to 200° C. being even more typical.

In some embodiments, the as-deposited ARC 16 may be subjected to a post deposition treatment to improve the properties of the entire layer or the surface of the ARC 16. This post deposition treatment can be selected from heat treatment, irradiation of electromagnetic wave (such as ultra-violet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise. The purpose of this post deposition treatment is to enhance the chemical, physical, electrical, and/or mechanical properties of the ARC 16 and/or the film stack, such as adhesion strength. The chemical properties include nature and/or location of surface functional groups, and hydrophilicity. The physical properties include density, moisture absorption, and heat conductivity. The mechanical properties include modulus, hardness, cohesive strength, toughness, resistance to crack and adhesion strength to its neighboring layers. The electrical properties include dielectric constant, electrical breakdown field, and leakage current.

The conditions described above for the post treatment of the optional dielectric cap may be used for the post treatment for ARC 16.

In one embodiment, the ARC 16 that is employed is an inorganic composition that includes elements of M, C (carbon) and H (hydrogen), wherein M is selected from at least one of the elements of Si, Ge, B, Sn, Fe, Ta, Ti, Ni, Hf and La. Such an ARC is described for example within U.S. Ser. No. 11/858,636, filed Sep. 20, 2007, now U.S. Patent Publication No. 2009/0079076 the entire content of which is incorporated herein by reference. This inorganic ARC may optionally include elements of O, N, S, F or mixtures thereof. In some embodiments, M is preferably Si. In some embodiments, the ARC composition may also be referred to as a vapor deposited M:C:H: optionally X material, wherein M is as defined above, C and H are carbon and hydrogen element, respectively, and X is at least one element of O, N, S and F.

In one embodiment, ARC 16 is produced by a vapor or liquid phase deposition (such as, for example, CVD, PECVD, PVD, ALD and spin-on coating) method using appropriate precursors or combination of precursors containing elements described above.

In a preferred embodiment, ARC 16 is a Si:C:H:X film. These Si containing films are deposited from at least one Si containing precursor. More particularly, the Si:C:H:X films are deposited from at least one Si containing precursor with, or without, additions of nitrogen and/or oxygen and/or fluorine and/or sulfur containing precursors. The Si containing precursor that is employed can comprise any Si containing compound including molecules selected from silane ($SiH_4$) derivatives having the molecular formula $SiR_4$, cyclic Si containing compounds including cyclocarbosilane where the R substituents may or may not be identical and are selected from H, alkyl, phenyl, vinyl, allyl, alkenyl or alkynyl groups that may be linear, branched, cyclic, polycyclic and may be functionalized with nitrogen containing substituents, any cyclic Si containing compounds including cyclosilanes, and cyclocarbosilanes.

Preferred Si precursors include, but are not limited to silane, methylsilane, dimethylsilane, trimethylsilane, tetramethylsilane, ethylsilane, diethylsilane, triethylsilane, tetraethylsilane, ethylmethylsilane, triethylmethylsilane, ethyldimethylsilane, ethyltrimethylsilane, diethyldimethylsilane, 1,1,3,3,-tetrahydrido-1,3-disilacyclobutane; 1,3-disilacyclobutane; 1,3-dimethyl-1,3-dihydrido-1,3-disilylcyclobutane; 1,1,3,3, tetramethyl-1,3-disilacyclobutane; 1,1,3,3,5,5-hexahydrido-1,3,5-trisilane; 1,1,3,3,5,5-hexamethyl-1,3,5-trisilane; 1,1,1,4,4,4,-hexahydrido-1,4-disilabutane; and 1,4-bis-trihydrosilyl benzene. Also the corresponding meta substituted isomers, such as dimethyl-1-propyl-3-silabutane; 2-silapropane, 1,3-disilacyclobutane, 1,3-disilapropane, 1,5-disilapentane, or 1,4-bis-trihydrosilyl benzene can be employed.

A single precursor such as silane amine, $Si(Net)_4$, can be used as the silicon, carbon and nitrogen source. Another preferred method is a mixture of precursors, a Si containing source such as silane, disilane, or an alkylsilane such as tetramethylsilane, or trimethylsilane, and a nitrogen containing source such as ammonia, amines, nitriles, aminos, azidos, azos, hydrizos. An additional carbon source and/or carbon and nitrogen containing source comprised of a linear, branched, cyclic or polycyclic hydrocarbon backbone of —$[CH_2]_n$—, where n is greater than or equal to 1, and may be substituted by functional groups selected from alkenes (—C═C—), alkynes (—C≡C—), amines (—C—N—), nitriles (—C≡N), amino (—$NH_2$), azido (—N═N═N—) and azo (—N═N—) may also be required. The hydrocarbon backbone may be linear, branched, or cyclic and may include a mixture of linear branched and cyclic hydrocarbon moieties. These organic groups are well known and have standard definitions that are also well known in the art. These organic groups can be present in any organic compound.

In some embodiments, the method may further include the step of providing a parallel plate reactor, which has an area of a substrate chuck from 85 $cm^2$ to 750 $cm^2$, and a gap between the substrate and a top electrode from 1 cm to 12 cm. A high frequency RF power is applied to one of the electrodes at a frequency from 0.45 MHz to 200 MHz. Optionally, an additional RF power of lower frequency than the first RF power can be applied to one of the electrodes. A single source precursor or a mixture of precursors which provide a silicon, carbon and nitrogen source are introduced into a reactor.

The conditions used for the deposition step may vary depending on the desired final properties of ARC 16. Broadly, the conditions used for providing the ARC 16 comprising elements of Si:C:H:X, include: setting the substrate temperature within a range from 100° C. to 700° C.; setting the high frequency RF power density within a range from 0.1 W/$cm^2$ to 2.0 W/$cm^2$; setting the gas flow rates within a range from 5 sccm to 10000 sccm, setting the inert carrier gases, such as helium (or/and argon) flow rate within a range from 10 sccm to 10000 sccm; setting the reactor pressure within a range from 1 Torr to 10 Torr; and setting the high frequency RF power within a range from 10 W to 1000 W. Optionally, a lower frequency power may be added to the plasma within a range from 10 W to 600 W. When the conductive area of the substrate chuck is changed by a factor of X, the RF power applied to the substrate chuck is also changed by a factor of X. Gas flows of silane, carbon and/or nitrogen gas precursors are flowed into the reactor at a flow rate within a range from 10 sccm to 1000 sccm. While gas precursors are used in the above example, liquid precursors may also be used for the deposition.

The atomic % ranges for M in such ARC materials are as follows: preferably 0.1 atomic % to 95 atomic %, more preferably 0.5 atomic % to 95 atomic %, most preferably 1 atomic % to 60 atomic % and most highly preferably 5 atomic % to 50 atomic %. The atomic % ranges for C in ARC 16 are as follows: preferably 0.1 atomic % to 95 atomic %, more preferably 0.5 atomic % to 95 atomic %, most preferably 1 atomic % to 60 atomic % and most highly preferably 5 atomic % to 50 atomic %. The atomic % ranges for H in ARC 16 are as follows: preferably 0.1 atomic % to 50 atomic %, more preferably 0.5 atomic % to 50 atomic %, most preferably 1 atomic % to 40 atomic % and most highly preferably 5 atomic % to 30 atomic %. The atomic % ranges for X in ARC 16 are as follows: preferably 0 atomic % to 70 atomic %, more preferably 0.5 atomic % to 70 atomic %, most preferably 1 atomic % to 40 atomic % and most highly preferably 5 atomic % to 30 atomic %.

The ARC 16 including elements of M, C and H may have a tunable index of refraction and extinction coefficient which can be optionally graded along the film thickness to match the optical properties of the substrate and the photoresist to be formed directly on it. Thus, the optical properties and the lithographic features of ARC 16 are superior to those obtained by conventional single layer ARC. The ARC's optical constants are defined here as the index of refraction n and the extinction coefficient k.

The ARC 16 including elements of M, C and H can be deposited also in a parallel plate PECVD reactor with the substrate positioned on the grounded electrode. In some embodiments, ARC 16 can be deposited at a substrate temperature up to 400° C., and in a high-density plasma type reactor under suitable chosen conditions. It should be noted that by changing process parameters such as bias voltage, gas mixture, gas flow, pressure and deposition temperature, the film's optical constants can be changed. In addition, the composition of the starting precursor as well as the introduction of oxygen, nitrogen, fluorine, and sulfur containing precursors also allows the tunability of these films.

In another embodiment, the ARC 16 that is employed is formed by a liquid deposition process including for example, spin-on coating, spray coating, dip coating, brush coating, evaporation or chemical solution deposition. This ARC formed by liquid deposition comprises a polymer that has at least one monomer unit comprising the formula M-$R^A$ wherein M is at least one of the elements of Si, Ge, B, Sn, Fe, Ta, Ti, Ni, Hf and La and $R^A$ is a chromophore. Such an ARC is described in U.S. Ser. No. 11/858,615, filed Sep. 20, 2007, now U.S. Pat. No. 7,709,370 the entire content of which is incorporated herein by reference. In some embodiments, M within the monomer unit may also be bonded to organic ligands including elements of C and H, a cross-linking component, another chromophore or mixtures thereof. The organic ligands may further include one of the elements of O, N, S and F. When the organic ligand is bonded to M, it is bonded to M' through C, O, N, S, or F.

In other embodiments, the ARC 16 formed by liquid deposition may also include at least one second monomer unit, in addition to the at least one monomer unit represented by the formula M-$R^A$. When present, the at least one second monomer unit has the formula M', —$R^B$, wherein M' is at least one of the elements of Si, Ge, B, Sn, Fe, Ta, Ti, Ni, Hf and La, and $R^B$ is a cross-linking agent. M and M' may be the same or different elements. In these two formulae, M and M' within the monomer unit may be also be bonded to organic ligands including atoms of C and H, a cross-linking component, a chromophore or mixtures thereof. The organic ligands may further include one of the elements of O, N, S and F. When the organic ligand is bonded to M and M', it is bonded to M or M' through C, O, N, S, or F.

The liquid ARC composition comprising M-R$^A$ or M-R$^A$ and M'-R$^B$ may also comprise at least one additional component, including a separate crosslinker, an acid generator or a solvent. When liquid deposition is employed, the ARC 16 is formed by liquid phase deposition of a liquid composition that includes an inorganic precursor that includes element of M, C and H, wherein M is at least one of the elements of Si, Ge, B, Sn, Fe, Ta, Ti, Ni, Hf and La. The inorganic precursor used in forming the ARC may optionally include elements of O, N, S, F or mixtures thereof. In some embodiments, M is preferably Si. The liquid composition also includes, in addition to the inorganic precursor, a chromophore, a cross-linking component, an acid generator and solvent.

One embodiment of the inorganic ARC 16 composition used in the liquid deposition embodiment comprises M-R$^A$ and M'-R$^B$ units, wherein M and M' are at least one of the elements of Si, Ge, B, Sn, Fe, Ta, Ti, Ni, Hf and La or are selected from Group IIIB to Group VIB, Group IIIA, and Group IVA. The inorganic precursor used in forming the ARC may optionally include elements of O, N, S, F or mixtures thereof. One embodiment of the ARC composition comprises the MO$_y$ unit which can be any one of many different metal-oxide forms. An exemplary list of such metal-oxide forms for a particular metal is as follows: MO$_3$; wherein M is Sc, Y, lanthanide, and Group IIIA; B, Al, Ga or In; MO$_4$; wherein M is Group IVB; Ti, Zr or Hf, and Group IVA; Sn or Ge; MO$_5$; wherein M is Group VB; V, Nb or Ta; or P. The Group VB metals are also known to form stable metal oxo forms, LMO$_3$, wherein L is an oxo; LMO; many of the listed metals form stable acetoacetato-metal complexes; LMO; many of the listed metals form stable cyclopentadienyl-metal complexes; LMO; wherein L is an alkoxy ligand; M is Sc, Y, or lanthanide, Group IVB, and Group VB; or LMO; wherein L is an alkyl or phenyl ligand; M is Group IIIA or Group IVA.

The chromophore, cross-linking component and acid generator that can be used in the liquid deposited ARC are defined in greater detail with respect to the following preferred embodiment of the present invention. In a preferred embodiment, the ARC 16 formed by liquid deposition is characterized by the presence of a silicon-containing polymer having units selected from a siloxane, silane, carbosilane, oxycarbosilane, silsesquioxane, alkyltrialkoxysilane, tetra-alkoxysilane, or silicon-containing and pendant chromophore moieties. The polymer containing these units may be a polymer containing these units in the polymer backbone and/or in pendant groups. Preferably, the polymer contains the preferred units in its backbone. The polymer is preferably a polymer, a copolymer, a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

The polymer should be soluble to form a solution and have film-forming characteristics conducive to forming an ARC by conventional spin-coating. In addition to the chromophore moieties discussed below, the silicon-containing polymer also preferably contains a plurality of reactive sites distributed along the polymer for reaction with the cross-linking component.

Examples of suitable polymers include polymers having the silsesquioxane (ladder, caged, or network) structure. Such polymers preferably contain monomers having structures (I) and (II) below:

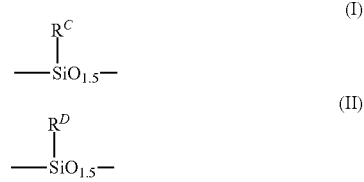

where R$^C$ comprises a chromophore and R$^D$ comprises a reactive site for reaction with the cross-linking component.

Alternatively, general linear organosiloxane polymers containing monomers (I) and (II) can also be used. In some cases, the polymer contains various combinations of monomers (I) and (II) including linear structures such that the average structure for R$^C$-containing monomers may be represented as structure (III) below and the average structure for R$^D$-containing monomers may be represented by structure (IV) below:

where x is from 1 to 1.5. In theory, x may be greater than 1.5, however, such compositions generally do not possess characteristics suitable for spin-coating processes (e.g., they form undesirable gel or precipitate phases).

Generally, silsesquioxane polymers are preferred. If the ordinary organosiloxane polymers are used (e.g., monomers of linear structures (I) and (III)), then preferably, the degree of cross-linking is increased compared to formulations based on silsesquioxanes.

The chromophore-containing groups Rc (or R$^A$ in the generic description above) may contain any suitable chromophore which (i) can be grafted onto the silicon-containing polymer (or M moiety of the generic monomer defined above) (ii) has suitable radiation absorption characteristics at the imaging wavelength, and (iii) does not adversely affect the performance of the layer or any overlying layers.

Preferred chromophore moieties include benzene and its derivatives, chrysenes, pyrenes, fluoranthrenes, anthrones, benzophenones, thioxanthones, and anthracenes. Anthracene derivatives, such as those described in U.S. Pat. No. 4,371,605 may also be used; the disclosure of this patent is incorporated herein by reference. In one embodiment, phenol, hydroxystyrene, and 9-anthracene methanol are preferred chromophores. The chromophore moiety preferably does not contain nitrogen, except for possibly deactivated amino nitrogen such as in phenol thiazine.

The chromophore moieties may be chemically attached by acid-catalyzed O-alkylation or C-alkylation such as by Friedel-Crafts alkylation. The chromophore moieties may also be chemically attached by hydrosilylation of SiH bond on the parent polymer. Alternatively, the chromophore moiety may be attached by an esterification mechanism. A preferred acid for Friedel-Crafts catalysis is HCl.

Preferably, 15 to 40% of the functional groups contain chromophore moieties. In some instances, it may be possible to bond the chromophore to the monomer before formation of the silicon-containing polymer. The site for attachment of the chromophore is preferably an aromatic group such as a hydroxybenzyl or hydroxymethylbenzyl group. Alternatively, the chromophore may be attached by reaction with other moieties such as cyclohexanol or other alcohols. The reaction to attach the chromophore is preferably an esterification of the alcoholic OH group.

$R^D$ (or $R^B$ in the generic description above) comprises a reactive site for reaction with a cross-linking component. Preferred reactive moieties contained in $R^D$ are alcohols, more preferably aromatic alcohols (e.g., hydroxybenzyl, phenol, hydroxymethylbenzyl, etc.) or cycloaliphatic alcohols (e.g., cyclohexanoyl). Alternatively, non-cyclic alcohols such as fluorocarbon alcohols, aliphatic alcohols, amino groups, vinyl ethers, and epoxides may be used.

Preferably, the silicon-containing polymer (before attachment of the chromophore) of a liquid deposited ARC 16 is poly(4-hydroxybenzylsilsesquioxane). Examples of other silsesquioxane polymers include: poly(p-hydroxyphenylethylsilsesquioxane), poly(p-hydroxyphenylethylsilsesquioxane-co-p-hydroxy-alpha-methylbenzylsilsesquioxane), poly(p-hydroxyphenylethylsilsesquioxane-co-methoxybenzylsilsesquioxane), poly(p-hydroxyphenylethylsilsesquioxane-co-t-butylsilsesquioxane), poly(p-hydroxyphenylethylsilsesquioxane-co-cyclohexylsilsesquioxane), poly(p-hydroxyphenylethylsilsesquioxane-co-phenylsilsesquioxane), poly(p-hydroxyphenylethylsilsesquioxane-co-bicycloheptylsilsesquioxane), poly(p-hydroxy-alpha-methylbenzylsilsesquioxane), poly(p-hydroxy-alpha-methylbenzylsilsesquioxane-co-p-hydroxybenzylsilsesquioxane), poly(p-hydroxy-alpha-methylbenzylsilsesquioxane-co-methoxybenzylsilsesquioxane), poly(p-hydroxy-alpha-methylbenzylsilsesquioxane-co-t-butylsilsesquioxane), poly(p-hydroxy-alpha-methylbenzylsilsesquioxane-co-cyclohexylsilsesquioxane), poly(p-hydroxy-alpha-methylbenzylsilsesquioxane-co-phenylsilsesquioxane), poly(p-hydroxy-alpha-methylbenzylsilsesquioxane-co-bicycloheptylsilsesquioxane), poly(p-hydroxybenzylsilsesquioxane-co-p-hydroxyphenylethylsilsesquioxane), and poly(p-hydroxy-alpha-methylbenzylsilsesquioxane-co-alpha-methylbenzylsilsesquioxane).

The Si containing polymers that can be used in a liquid deposited ARC 16 preferably have a weight average molecular weight, before reaction with the cross-linking component, of at least 1000, more preferably a weight average molecular weight of 1000-10000.

The cross-linking component of the liquid deposited ARC 16 is preferably a crosslinker that can be reacted with an SiO containing polymer in a manner which is catalyzed by generated acid and/or by heating. This cross-linking component can be inorganic or organic in nature. It can be a small compound (as compared with a polymer or copolymer) or a polymer, a copolymer, or a blend including at least two of any combination of polymers and/or copolymers, wherein the polymers include one monomer and the copolymers include at least two monomers. Generally, the cross-linking component used in the liquid deposited antireflective coating compositions may be any suitable cross-linking agent known in the negative photoresist art which is otherwise compatible with the other selected components of the composition. The cross-linking agents preferably act to crosslink the polymer component in the presence of a generated acid. Preferred cross-linking agents are glycoluril compounds such as tetramethoxymethyl glycoluril, methylpropyltetramethoxymethyl glycoluril, and methylphenyltetramethoxymethyl glycoluril, available under the POWDERLINK trademark from American Cyanamid Company. Other possible cross-linking agents include: 2,6-bis(hydroxymethyl)-p-cresol, compounds having the following structures:

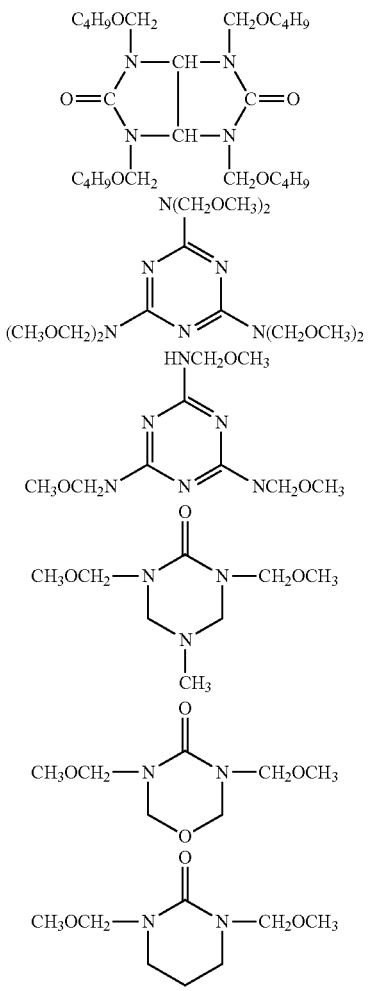

including their analogs and derivatives, such as those found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycolurils, for example as can be found in Canadian Patent No. 1 204 547. Other cross-linking agents such as bis-epoxies or bis-phenols (e.g., bisphenol-A) may also be used. Combinations of cross-linking agents may be used. The cross-linking component may be chemically bonded to the Si containing polymer backbone.

In another embodiment, the cross-linking component is a silicon-containing polymer having at least one unit selected from a siloxane, silane, carbosilane, oxycarbosilane, silsesquioxane, alkyltrialkoxysilane, and tetra-alkoxysilane. The polymer is preferably a polymer, a copolymer, a blend including at least two of any combination of polymers and/or copolymers, wherein the polymers include one monomer and the copolymers include at least two monomers and wherein the monomers of the polymers and the monomers of the copolymers are selected from a siloxane, silane, carbosilane, oxycarbosilane, silsesquioxane, alkyltrialkoxysilane, tetra-alkoxysilane, unsaturated alkyl substituted silsesquioxane, unsaturated alkyl substituted siloxane, unsaturated alkyl substituted silane, an unsaturated alkyl substituted carbosilane, unsaturated alkyl substituted oxycarbosilane, carbosilane substituted silsesquioxane, carbosilane substituted siloxane, carbosilane substituted silane, carbosilane substituted carbosilane, carbosilane substituted oxycarbosilane, oxycarbosilane substituted silsesquioxane, oxycarbosilane substituted siloxane, oxycarbosilane substituted silane, oxycarbosilane substituted carbosilane, and oxycarbosilane substituted oxycarbosilane.

The acid generator used in the liquid deposited ARC composition is preferably an acid generator compound that liberates acid upon thermal treatment. A variety of known thermal acid generators are suitably employed such as, for example, 2,4,4,6-tetrabromocyclohexadienone, benzoin tosylate, 2-nitrobenzyl tosylate and other alkyl esters of organic sulfonic acids, blocked alkyl phosphoric acids, blocked perfluoroalkyl sulfonic acids, alkyl phosphoric acid/amine complexes, perfluoroalkyl acid quats wherein the blocking can be by covalent bonds, amine and quaternary ammonium. Compounds that generate a sulfonic acid upon activation are generally suitable. Other suitable thermally activated acid generators are described in U.S. Pat. Nos. 5,886,102 and 5,939,236; the disclosures of these two patents are incorporated herein by reference. If desired, a radiation-sensitive acid generator may be employed as an alternative to a thermally activated acid generator or in combination with a thermally activated acid generator. Examples of suitable radiation-sensitive acid generators are described in U.S. Pat. Nos. 5,886,102 and 5,939,236. Other radiation-sensitive acid generators known in the resist art may also be used as long as they are compatible with the other components of the antireflective composition. Where a radiation-sensitive acid generator is used, the cure (cross-linking) temperature of the composition may be reduced by application of appropriate radiation to induce acid generation which in turn catalyzes the cross-linking reaction. Even if a radiation-sensitive acid generator is used, it is preferred to thermally treat the composition to accelerate the cross-linking process (e.g., for wafers in a production line).

The antireflective coating compositions used in the liquid deposition process preferably contain (on a solids basis) in a suitable solvent commonly known to those skilled in the art (i) from 10 wt % to 98 wt. % of a polymer including M, more preferably from 70 wt. % to 80 wt. %, (ii) from 1 wt % to 80 wt. % of cross-linking component, more preferably from 3 wt. % to 25%, most preferably from 5 wt. % to 25 wt. %, and (iii) from 1 wt. % to 20 wt. % acid generator, more preferably 1 wt. % to 15 wt. %.

After liquid depositing the ARC 16, a post deposition baking step is typically, but not necessarily always, used to remove unwanted components, such as solvent, and to effect crosslinking. When performed, the baking step is conducted at a temperature from 60° C. to 400° C., with a baking temperature from 80° C. to 300° C. being even more preferred. The duration of the baking step varies and is not critical to the practice of the present invention. The baked and previously liquid deposited ARC 16 may further undergo a post curing treatment process. This post curing treatment may include one of the post treatments used above for the optional dielectric cap. As such, the various post treatments and conditions used above in treating the optional dielectric cap are incorporated herein by reference.

In addition, the composition of the starting precursor used in liquid deposition as well as the introduction of oxygen, nitrogen, fluorine containing precursors also allows the tunability of these films. In either embodiment mentioned above, the ARC's optical constants are defined here as the index of refraction n and the extinction coefficient k. In general, ARC 16 can be modeled so as to find optimum optical parameters (n and k values) of ARC as well as optimum thickness. The preferred optical constants of the ARC 16 are in the range from n=1.4 to n=2.6 and k=0.01 to k=0.78 at a wavelength of 248, 193 and 157, 126 nm and extreme ultraviolet (13.4 nm) radiation.

In addition to the above, ARC 16 in any embodiment does not interact with the photoresist, e.g., PPLK material, to induce residue, footing or undercutting. Moreover, ARC 16 has good etch selectivity to the cured and patterned PPLK material. Etch selectivities of 1.5-4 to 1 of the ARC 16 to the cured and patterned PPLK material can be obtained. Furthermore, the use of the ARC 16 of described above (vapor or liquid deposited) maintains the pattern and structural integrity after curing of the patterned PPLK material. This is critical as ARC layer 16 is retained as a permanent part of the final interconnect stack.

In some embodiments of the invention, the optional dielectric layer and the ARC 16 can be combined into a graded cap that includes properties of both a dielectric cap layer and an ARC. Such a graded cap includes at least a lower region that includes elements of a dielectric cap and an upper region that includes elements of an ARC. The graded cap can be formed utilizing any of the methods mentioned above in forming the dielectric cap and/or ARC.

The initial interconnect structure 10 shown in FIG. 1A further includes a processed positive-tone PPLK material 18, and a plurality of metal lines 20 within the processed positive-tone PPLK material 18. The PPLK material is formed utilizing a deposition process including, for example, spin-on-coating, dip coating, brush coating, blade coating, chemical solution deposition, and ink-jet dispensing. After applying the PPLK material, a post deposition baking step is typically, but not necessarily always, employed to remove unwanted components, such as solvent. When performed, the baking step can be conducted at a temperature from 40° C. to 200° C., with a baking temperature from 60° C. to 140° C. being more preferred. The duration of the baking step varies from 10 seconds to 600 seconds and is not critical herein. The thickness of the applied PPLK material may vary depending on the requirement of the chip and the technique used to form the same as well as the material make-up of the applied PPLK material. Typically, the applied PPLK material has a thickness from 1 nm to 50000 nm, with a thickness from 20 nm to 5000 nm being more typical.

After applying the PPLK material, the PPLK material is processed to include at least one, typically, a plurality, of metal lines 20 (e.g., conductively filled openings). The metal lines 20 are typically separated from the PPLK material by a diffusion barrier 19. The metal lines 20 are formed within the PPLK material by conventional lithography (including a pattern wise exposure step) and etching. An optional post-exposure baking may be required to effect the photochemical reactions. When performed, the baking step is conducted at a temperature from 60° to 200° C., with a baking temperature from 80° to 140° C. being more preferred. The duration of the baking step varies and is not critical to the practice of the present invention. After exposure and post-exposure baking, the latent images are developed with an appropriate developer, usually an aqueous base solution, such as 0.26N tetramethylammoniahydroxide (TMAH) solution, to form a relief PPLK pattern.

The pattern wise exposing process can be accomplished in a variety of ways, including, for example, through a mask with a lithography stepper or a scanner with an exposure light source of G-line, Mine (365 nm), DUV (248 nm, 193 nm, 157 nm, 126 nm), Extreme UV (13.4 nm), or an electron beam. The exposing process may be performed in a dry mode or an immersion mode. The first pattern-wise exposing process also includes direct writing without the use of a mask with, for example, light, electron beam, ion beam, and scanning probe lithography. Other patterning techniques that can be used include contact printing techniques such as nanoimprint lithography, embroising, micro contact printing, replica molding, microtransfer molding, micromolding in capillaries and solvent-assisted micromolding, thermal assisted embroising, inject printing, and the like.

After the pattern wise exposure and development, the thus formed opening within the PPLK material is filled with an electrically conductive material and planarization forming the initial interconnect structure shown in FIG. 1A. In some embodiments, and as mentioned above, a diffusion barrier 19, which may comprise Ta, TaN, Ti, TiN, Ru, RuTaN, RuTa, W, WN or any other material that can serve as a barrier to prevent electrically conductive material from diffusing through, is typically formed prior to filling opening within the PPLK material with the electrically conductive material. The diffusion barrier 19 can be formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating. In some embodiments (not shown), the diffusion barrier 19 may comprise a combination of layers. The thickness of the diffusion barrier 19 may vary depending on the exact means of the deposition process employed as well as the material and number of layers employed. Typically, the diffusion barrier 19 has a thickness from 4 to 40 nm, with a thickness from 7 to 20 nm being more typical.

Following the formation of the diffusion barrier, the remaining region of each opening formed into the developed PPLK material is filled with an electrically conductive material forming a metal line 20. The electrically conductive material includes, for example, polySi, an electrically conductive metal, an alloy comprising at least one electrically conductive metal, an electrically conductive metal silicide, an electrically conductive nanotube or nanowire, graphene or combinations thereof. In one embodiment, the electrically conductive material is a conductive metal such as Cu, W or Al, with Cu or a Cu alloy (such as AlCu) being highly preferred in the present invention. The electrically conductive material is filled into the opening of the developed PPLK material utilizing a conventional deposition process including, but not limited to CVD, PECVD, sputtering, chemical solution deposition or plating. In some embodiments, electrochemical plating is preferred technique used in filling the opening within the developed PPLK material with the electrically conductive material.

Figure 1B:
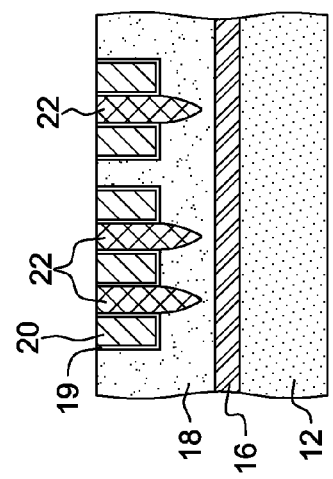

Reference is now made to FIG. 1B, which illustrates the initial interconnect structure 10 of FIG. 1A after subjecting the initial structure 10 to a second exposure step. This second exposure to irradiation is preferably an exposure through another set of masks. In FIG. 1B, reference numeral 22 denotes portions of the processed PPLK material that are exposed. The exposed portions 22 of the processed PPLK material 18 are formed between at least one pair of neighboring metal lines 20. In the second exposure step, a mask (not shown) is typically used and the processed PPLK material 18 including the plurality of metal lines 20 is subjected to one of the above mentioned exposure processes. Typically, an exposure light source of G-line, Mine (365 nm), DUV (248 nm, 193 nm, 157 nm, 126 nm), or an electron beam is employed in this step. The depth of the exposed portions 22 of the processed PPLK material 18 can vary and can be controlled by the conditions of the exposure technique employed. In one embodiment, and as shown, the exposed portions 22 of the processed PPLK material 18 have a depth that extends beneath the depth of the metal lines. In other embodiments (not shown), the exposed portions of the processed PPLK material have a depth that is less than the depth of the metal lines. In yet a further embodiment (also not shown), the exposed portions of the processed PPLK material have different depths.

Figure 1C:
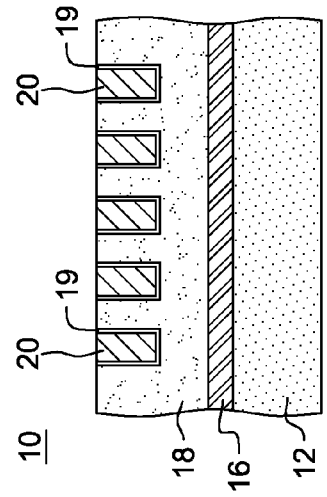

Reference is now made to FIG. 1C, which shows the structure of FIG. 1B, after developing the exposed portions 22 of the processed PPLK material 18 utilizing a conventional developer such as the conventional aqueous base developer mentioned above. In some embodiments, other developers may be used, including organic developers or a mixture of developers. In FIG. 1C, reference numeral 24 denotes the gaps that are formed after performing the aforementioned development step.

Figure 1D:
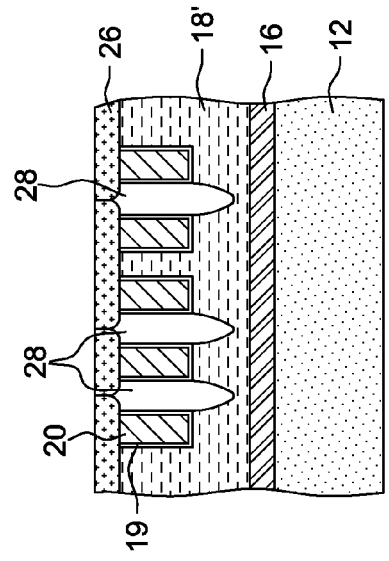

Reference is now made to FIG. 1D, which illustrates the structure of FIG. 1C after performing a curing step which converts the processed PPLK material into a processed and cured PPLK material 18'. It is observed that the processed and cured PPLK material 18' remains as a permanent low-k interconnect dielectric material within the structure. Curing is performed by a thermal cure, an electron beam cure, an ultraviolet (UV) cure, an ion beam cure, a plasma cure, a microwave cure or a combination thereof. The conditions for each of the curing processes are well known to those skilled in the art and any condition can be chosen as long as it converts the processed PPLK material 18 into a processed and cured PPLK material 18' that maintains structure fidelity and provides good electrical and mechanical properties. The cured product of processed PPLK material has a dielectric constant of 4.3 or less, with a dielectric constant of less than 3.8 being more typical.

In one embodiment, the irradiation cure step is performed by a combination of a thermal cure and an ultra-violet (UV) cure wherein the wavelength of the ultra-violet (UV) light is from 50 to 300 nm and the light source for the ultra-violet (UV) cure is a UV lamp, an excimer (exciplex) laser or a combination thereof. The excimer laser may be generated from at least one of the excimers selected from the group consisting of $Ar_2^*$, $Kr_2^*$, $F_2$, $Xe_2^*$, ArF, KrF, XeBr, XeCl, XeCl, XeF, $CaF_2$, KrCl, and $Cl_2$ wherein the wavelength of the excimer laser is in the range from 50 to 300 nm. Additionally, the light of the ultra-violet (UV) cure may be enhanced and/or diffused with a lens or other optical diffusing device known to those skilled in the art.

In another embodiment, the curing step is a combined UV/thermal cure. This combined UV/thermal cure is carried out in a UV/thermal cure module under vacuum or inert atmosphere, such as $N_2$, He, Ar. Typically, the UV/thermal cure temperature is from 100° C. to 500° C., with a cure temperature from 300° to 450° C. being more typical. The duration of the UV/thermal cure is from 0.5 min to 30 min with a duration from 1 to 10 min being more typical. The UV cure module is designed to have a very low oxygen content to avoid degradation of the resultant dielectric materials.

Figure 1E:
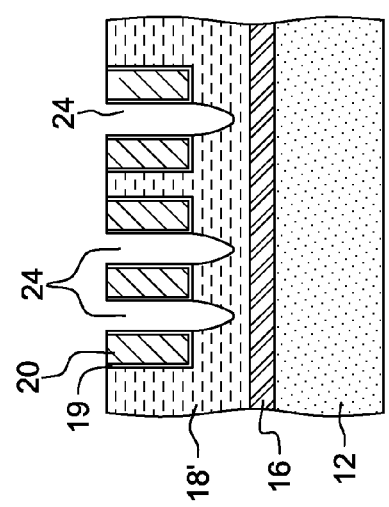

Reference is now made to FIG. 1E, which illustrates the structure of FIG. 1D after forming a dielectric cap 26 atop the processed and cured PPLK material 18'. As shown, the dielectric cap 26 seals off the gaps 24 forming air gaps 28 within the interconnect structure. Dielectric cap 26 includes the same or different material as optional dielectric cap mentioned above. Moreover, the dielectric cap 26 can be formed utilizing one of the techniques mentioned above for optional dielectric cap and the dielectric cap 26 can have a thickness within the range mentioned for the optional dielectric cap.

Reference is now made to FIGS. 2A-2D, which illustrates a second embodiment of the invention. The second embodiment of the invention that is illustrated within FIGS. 2A-2D is referred to herein as a metal first negative-tone PPLK scheme. The metal first negative-tone PPLK scheme illustrated within FIGS. 2A-2D begins by first providing the initial interconnect structure 100 shown in FIG. 2A. The initial interconnect structure 100 is similar to the initial interconnect structure 10 shown in FIG. 1A expect that a low k dielectric material 102 is positioned between the processed PPLK material 18 and the underlying ARC 16, and/or optional dielectric cap, or the substrate 12; the processed PPLK material 18 in this embodiment is a negative-tone PPLK material, not a positive-tone as in the embodiment illustrated in FIG. 1A. The term "low k dielectric material" is used throughout the present invention to denote a dielectric material having a dielectric constant of less than 4.3, with a dielectric constant of less than 3.8 being more typical. In some embodiments, the low k dielectric material 102 can be porous, while in other embodiments the low k dielectric material 102 can be non-porous.

The low k dielectric material 102 can include any conventional interconnect inorganic or organic dielectric material including, for example, silicon oxide, a silsesquioxane, a C doped oxide (i.e., an organosilicate) that includes atoms of Si, C, O and H, a thermosetting polyarylene ether or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In some embodiments, the low k dielectric material 102 is a positive-tone or negative-tone PPLK material that has been deposited and cured into a cured PPLK material. The cured PPLK material can be used alone or in conjunction with one of the other low k dielectric materials mentioned above.

The thickness of the low k dielectric material 102 may vary depending on the type of dielectric material employed, as well as the technique used in forming the same. Typically, the low k dielectric material 102 has a thickness from 10 nm to 1 μm, with a thickness from 20 nm to 200 nm being more typical. The low k dielectric material 102 can be formed utilizing any conventional deposition process including, but not limited to CVD, PECVD, spin-on containing, chemical solution deposition, and evaporation.

The other elements of the initial interconnect structure 100 including the substrate 12, ARC 16 have the same reference numerals as in the initial interconnect structure shown in FIG. 1A. In this embodiment, an optional dielectric cap (not shown) can be positioned between the substrate 12 and the ARC 16. It is noted that the other elements shown in FIG. 2A are formed as described above and a negative-tone PPLK material is used instead of the positive-tone PPLK material for processed PPLK material 18.

Figure 2A:
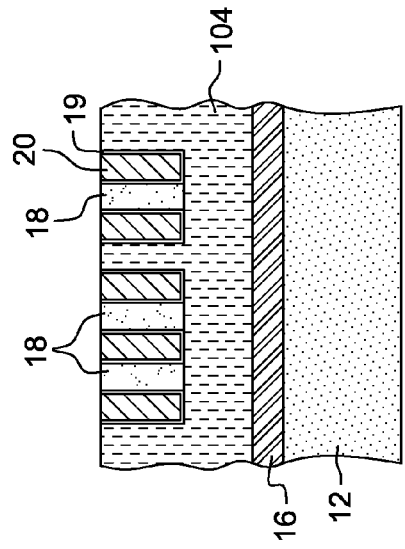
FIGS. 2A-2D are pictorial representations (through cross sectional views) depicting the basic processing steps employed in a second embodiment of the invention which can be referred to herein as a metal first negative-tone PPLK scheme.
Figure 2B:
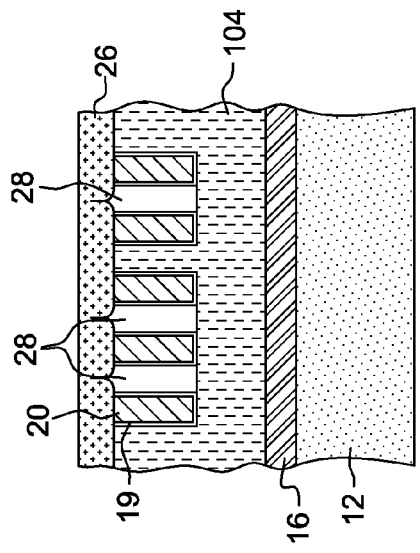

Reference is now made to FIG. 2B which illustrates the structure of FIG. 2A after subjecting the same to a second exposure step. In FIG. 2B, reference numeral 104 denotes the exposed portions of the processed PPLK material 18. In this embodiment, the exposed portions 104 of the processed PPLK material 18 are converted to cured dielectric material portions that have a dielectric constant of 4.3 or less. It is noted that the exposed portions 104 of the processed PPLK material remain in the final interconnect structure as a permanent dielectric material. The second exposure step is the same as that described above for the second exposure step in the first embodiment of the invention.

Figure 2C:
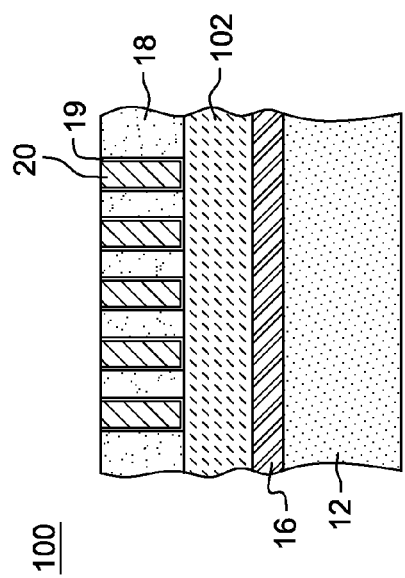

FIG. 2C illustrates the structure of FIG. 2B after removing the non-exposed portions of the processed PPLK material 18 forming gaps 24 between the metal lines 20. The removal of the non-exposed portions of the processed PPLK material is performed utilizing a conventional developer such as, for example, tetramethyl ammonium hydroxide (TMAH). In some embodiments, other developers may be used, including organic developers or a mixture of developers.

Figure 2D:
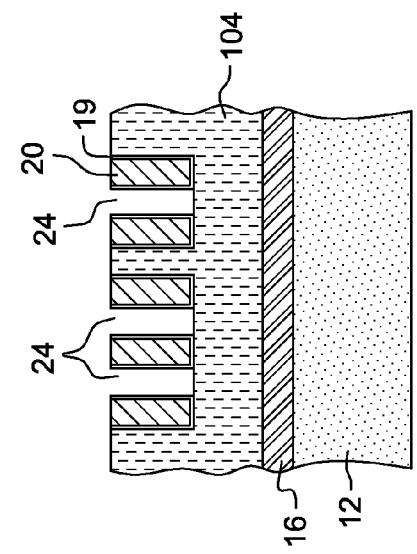

FIG. 2D illustrates the structure of FIG. 2C after forming a dielectric cap 26 onto the structure that seals off the gaps 24 forming air gaps 28 between the metal lines. The material of the dielectric cap 26, the thickness thereof and the techniques that can be used in forming the same have been mentioned herein above.

Reference is now made to FIGS. 3A-3E in which a third embodiment of the invention is illustrated. The third embodiment of the invention is referred to herein as a gap first positive-tone PPLK scheme. The third embodiment and the fourth embodiment to follow are different from the first and second embodiments described above. In the first and second embodiments described above, the metal lines were formed prior to gap formation. In contrast, and in the third and fourth embodiments, the gap is formed prior to forming the metal lines.

With respect to the third embodiment, the initial interconnect structure 200 shown in FIG. 3A is employed. The initial interconnect structure 200 shown in FIG. 3A includes a substrate 12, an ARC 16 and a non-processed PPLK material 202. An optional dielectric cap (not shown) can be located between the substrate 12 and the ARC 16. The non-processed PPLK material 202 is similar to the processed PPLK material 18 of the first embodiment except that no metal lines are formed into the initial interconnect structure at this point of the process. It is emphasized the non-processed PPLK material 202 is a positive-tone PPLK material as described above.

Reference is now made to FIG. 3B, which illustrates the initial interconnect structure 200 of FIG. 3A after subjecting the same to a first exposure step in which portions of the non-processed PPLK material 202 are patterned wise exposed. The exposed portions of the non-processed PPLK material 202 are labeled by reference numeral 204 in FIG. 3B. The first exposure step includes the use of a mask (not shown) and one of the above mentioned exposure processes as used in processing the PPLK material in the first embodiment can be employed in this embodiment as well.

Reference is now made to FIG. 3C which illustrates the structure after processing the non-processed PPLK material 202 including the exposed portions 204 to include a plurality of metal lines 20. The step includes forming a hard mask (not shown) on the surface of the structure shown in FIG. 3B. The hard mask may include any conventional hard mask material including a semiconductor oxide, semiconductor nitride, semiconductor oxynitride or mutilayers thereof. The hard mask can be formed by any conventional deposition technique including, for example, CVD, PECVD, chemical solution deposition, and evaporation. Alternatively and in other embodiments, a thermal process such as, for example, thermal oxidation or nitridation can be employed. In yet further embodiments, the hard mask can be formed by a combination of a deposition process and a thermal process. The thickness of the hard mask may vary and is within ranges that are well known to those skilled in the art.

After forming the hard mask, a patterned resist (not shown) is formed atop the hard mask utilizing a conventional lithography step. The metal lines are then processed utilizing a second exposure step and etching. The second exposure is the same as the first exposure step described above for the first embodiment of the invention. The etching step which may include dry etching and/or chemical wet etching transfers the resist pattern into the hard mask and then the non-processed PPLK material 202 including the exposure portions 204. Typically, the patterned resist is removed after the resist pattern has been transferred into the hard mask. Openings are formed in the non-processed PPLK material 202 which are then filled with at least the electronically conductive material described above in the first embodiment. After filling the openings with the electrically conductive material, a planarization process is performed forming the structure shown in FIG. 3C. In FIG. 3C, reference numeral 202' denotes the processed PPLK material, reference numeral 204 denotes the previous exposed portions of the non-processed PPLK material 202, and reference numeral 20 denotes the metal lines.

Reference is now made to FIG. 3D, which illustrates the structure of FIG. 3C after developing exposed portions 204 of the non-processed PPLK material and curing. The developing of the exposed portions 204 includes the use of a conventional developer as mentioned in the first embodiment, while the curing includes one of the curing techniques mentioned in the first embodiment of the invention as well. The curing step converts the processed PPLK material 202' into a processed and cured PPLK material 202" that remains as a permanent low k dielectric material within the interconnect structure. After development, gaps 24 are formed between the metal lines that are formed into the PPLK material.

Reference is now made to FIG. 3E, which illustrates the structure of FIG. 3D after forming a dielectric cap 26 atop the structure which seals off the gaps 24 forming air gaps 28. The material of the dielectric cap 26, the techniques used in forming the same as well as the thickness of the dielectric cap 26 is the same as in the first embodiment of the invention.

Reference is now made to FIGS. 4A-4E, which illustrates a fourth embodiment of the invention. The fourth embodiment of the present invention is referred to herein as a gap first negative-tone scheme. The fourth embodiment of the invention begins by providing the initial interconnect structure 300 shown in FIG. 4A. The initial interconnect structure 300 is similar to the initial structure that is shown in FIG. 2A and it includes a substrate 12, ARC 16, low k dielectric material 202 and a non-processed PPLK material 302 made from a negative-tone PPLK composition. An optional dielectric cap (not shown) can be positioned between the substrate 12 and the ARC 16. The non-processed PPLK material 302 is formed by applying a negative-tone PPLK resist composition onto the surface of low k dielectric material 202.

Figure 4B:
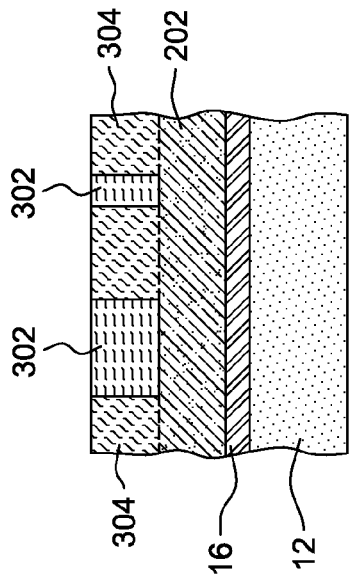
FIGS. 4A-4E are pictorial representations (through cross sectional views) depicting the basic processing steps employed in a fourth embodiment of the invention which can be referred to herein as a gap first negative-tone PPLK scheme.
Figure 4E:
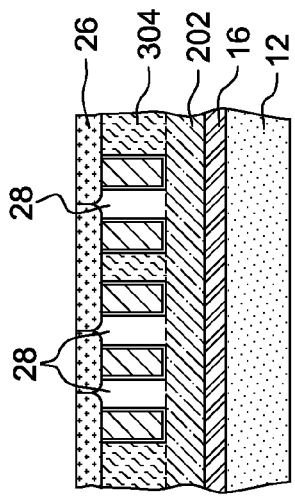
Figure 4A:
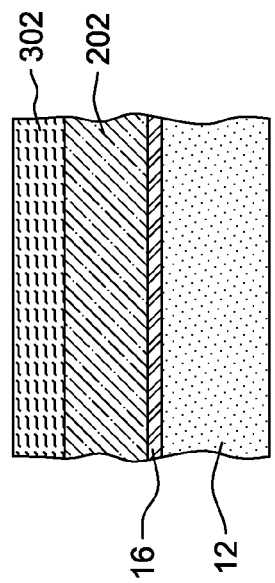

Reference is now made to FIG. 4B, which illustrates the structure of FIG. 4A after performing a first exposure step in which the exposed portions 304 of the non-processed PPLK material are converted into a permanent low k dielectric material. The first exposure step includes a mask exposure step including one of the techniques mentioned above.

Figure 4D:
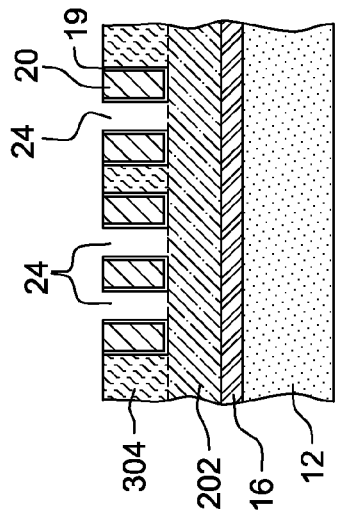
Figure 4C:
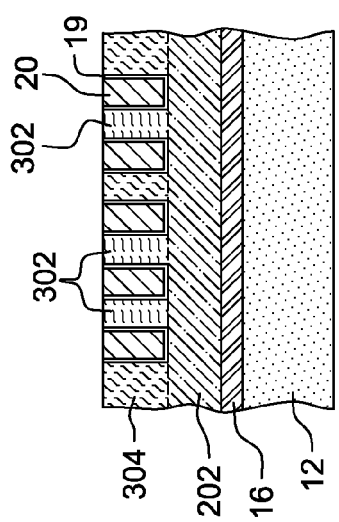

Referring now to FIG. 4C, there is illustrated the structure of FIG. 4B after forming metal lines 20 within the structure. The metal lines 20 are formed as described in above in FIG. 3C for the third embodiment of the invention. This includes hard mask formation, pattern resist formation, transferring the pattern into the hard mask and the PPLK material via etching, and filing the openings formed by etching with at least one electrically conductive material.

Referring now to FIG. 4D, there is shown the structure of FIG. 4C after removing the remaining non-exposed portions of the non-processed PPLK material 302 from the structure providing gaps 24. The non-exposed portions of the non-processed PPLK material 302 are removed utilizing a conventional developer including, for example, tetramethyl ammonium hydroxide (TMAH). In some embodiments, other developers may be used, including organic developers or a mixture of developers.

Referring now to FIG. 4E, there is illustrated the structure of FIG. 4D after forming a dielectric cap 26 atop the structure which seals off the gaps 24 forming a structure including air gaps 28. The material of the dielectric cap 26, the thickness thereof and the techniques that can be used in forming the same have been mentioned herein above.

Figure 5C:
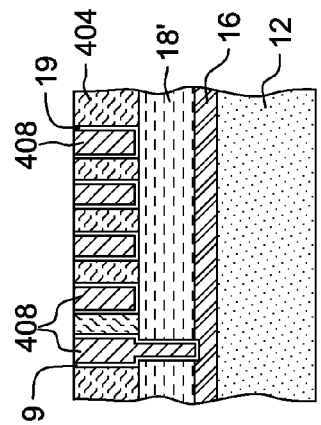
FIGS. 5A-5E are pictorial representations (through cross sectional views) depicting the basic processing steps employed in a fifth embodiment of the invention which can be referred to herein as a gap first positive-tone PPLK all litho scheme.
Figure 5B:
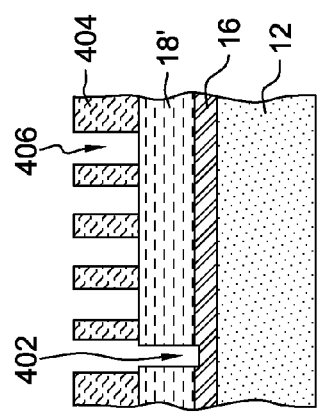
Figure 5A:
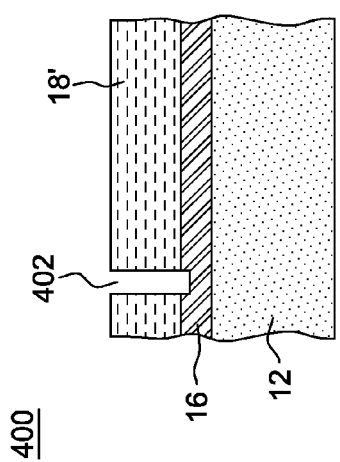

Reference is now made to FIGS. 5A-5E, which depict the basic processing steps employed in a fifth embodiment of the invention. The fifth embodiment of the present invention can be referred to herein as a gap first positive-tone PPLK all litho scheme. The fifth embodiment of the invention begins by providing the initial structure 400 illustrated in FIG. 5A. The initial structure 400 includes a substrate 12, an ARC 16 located on an upper surface of the substrate 12, and cured PPLK material 18' including a least one via opening 402 that extends through the cured PPLK material 18' to an upper surface of ARC 16. An optional dielectric cap (not shown) can be located between the substrate 12 and the ARC 16. The material layers 12, 16 and 18 (a positive-tone PPLK material 18 is used in this embodiment and it is cured into cured PPLK material 18') present within the initial structure 400 shown in FIG. 5A are the same as those described above in the first embodiment of the invention. Each of layers 12, 16 and 18 can be formed utilizing techniques as described above in the first embodiment of the invention as well. After forming the PPLK material 18, the PPLK material 18 is subjected to a first lithography step in which the PPLK material is exposed to a via pattern of radiation. After this exposure, the exposed PPLK material is developed forming the at least one via opening 402 within the structure. Curing is thereafter performed. The lithographic process and curing that is employed here for the fifth embodiment of the invention is the same as that used in the first embodiment of the invention. In some embodiments, the cured PPLK material 18' is a low-k material as defined above in which a via pattern is present that is defined by lithography and etching.

Referring now to FIG. 5B, there is illustrated the structure of FIG. 5A after forming a second PPLK material 404 that includes a plurality of line openings 406 therein. The second PPLK material 404 can be the same or different, typically the same, PPLK material as PPLK material 18. The thickness of the second PPLK material 404 can be within the range mentioned above for PPLK material 18 and it can be formed utilizing one of the deposition techniques mentioned above for PPLK material 18. The plurality of line openings 406 are formed within the second PPLK material 404 utilizing a conventional lithography step which includes exposure and development. As shown, one of the plurality of line openings 406 is located directly atop the via opening 402 that is present in cured PPLK material 18'.

Referring now to FIG. 5C, there is illustrated the structure of FIG. 5B after forming a diffusion barrier 19 within the via and line opening and then filling the remaining portions of each opening with a conductive material including one of the conductive materials used in formed metal line 20. The conductively filled openings are labeled as 408 in FIG. 5C. The diffusion barrier 19 used in the fifth embodiment includes one of the diffusion barrier materials mentioned above in the first embodiment. The diffusion barrier 19 can be formed utilizing one of the techniques mentioned above in the first embodiment as well. The conductively filled openings 408 are filled with a conductive material as mentioned in the first embodiment in forming metal lines 20, and an optional planarization process can follow the filling of the openings.

Figure 5E:
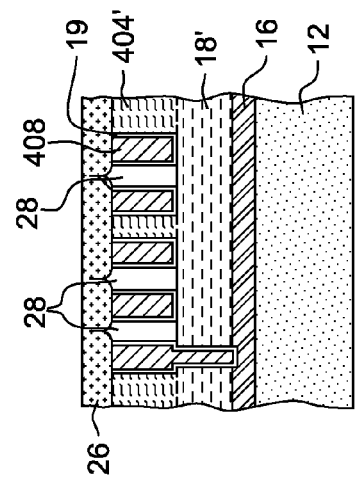
Figure 5D:
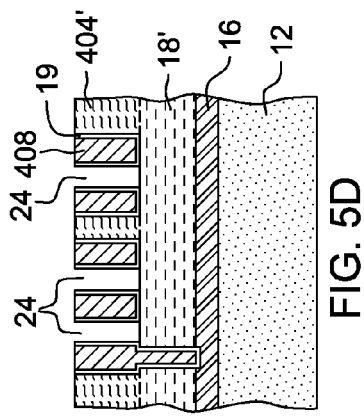

Referring now to FIG. 5D, there is illustrated the structure of FIG. 5C after exposing selected portions of the second PPLK material 404 that is located between preselected neighboring conductively filled openings 408 to one of the exposure light sources mentioned above in the first embodiment, developing the exposed areas forming gaps 24 between preselected neighboring conductively filled openings 408 and curing the second PPLK material 404 forming cured second PPLK material 404'. The exposure, development and curing used in this embodiment of the invention is the same as that used in the first embodiment in providing the structures shown in FIGS. 1B, 1C and 1D.

Referring now to FIG. 5E, there is illustrated the structure of FIG. 5D, after forming a dielectric cap 26 atop the cured second PPLK material 404'. As is shown, the dielectric cap 26 seals off the gaps 24 forming air gaps 28 within the structure. The dielectric cap 26 is the same as that mentioned above in the first embodiment of the invention.

Reference is now made to FIGS. 6A-6D which are pictorial representations (through cross sectional view) depicting the basic processing steps employed in a sixth embodiment of the invention. The sixth embodiment of the invention can be referred to herein as a positive-tone all-litho metal mask scheme. The sixth embodiment of the invention begins by first providing the initial structure 500 shown in FIG. 6A. Initial structure 500 is the same as that of initial structure 400 utilized above in the fifth embodiment of the invention.

Figure 6A:
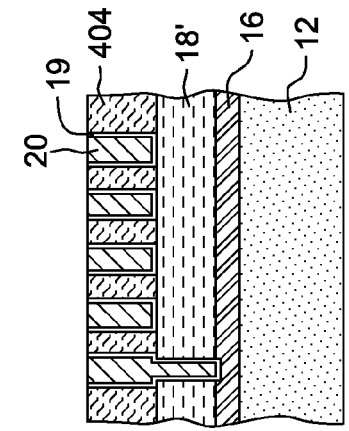
FIGS. 6A-6D are pictorial representations (through cross sectional view) depicting the basic processing steps employed in a sixth embodiment of the invention which can be referred to herein as a positive-tone all-litho metal mask scheme.
Figure 6B:
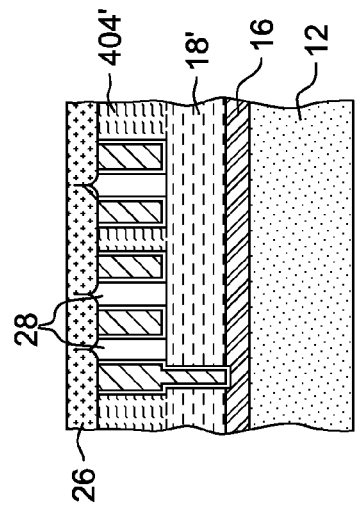

Referring now to FIG. 6B, there is illustrated the structure of FIG. 6A after forming a second PPLK material 404 atop the cured PPLK material 18' which also completely fills in via opening 402, after forming line openings within the second PPLK material, and after filling the various openings with a diffusion barrier 19 and an electrically conductive material as described above for metal line 20. The line openings (not specifically shown and labeled) are formed using a patterned hardmask (not shown) that is formed atop the second PPLK material 404. The patterned hardmask can be composed of a dielectric oxide, nitride, oxynitride, or any mulitilayered stack thereof. A conventional deposition process can be used in forming a blanket layer of hardmask material atop the second PPLK material. After forming the blanket layer of hardmask material, a lithography and etching step can be used to provide the patterned hardmask. The patterned hardmask is removed after forming the line openings within the second PPLK material utilizing conventional techniques that are well known to those skilled in the art.

Figure 6C:
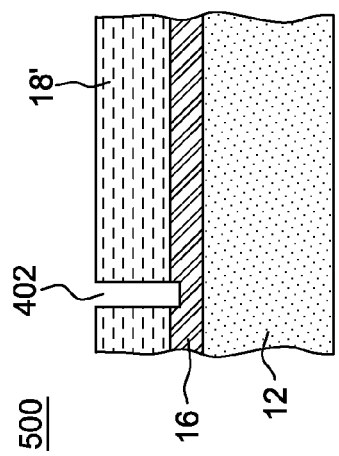

Referring now to FIG. 6C, there is illustrated the structure of FIG. 6B after forming gaps 24 within the second PPLK material 404 between preselected conductively filled openings 408 and curing the second PPLK material 404 into cured second PPLK material 404'. Gaps 24 are formed utilizing exposure, development and curing processing as described in the first embodiment in providing the structures shown in FIGS. 1B, 1C and 1D.

Figure 6D:
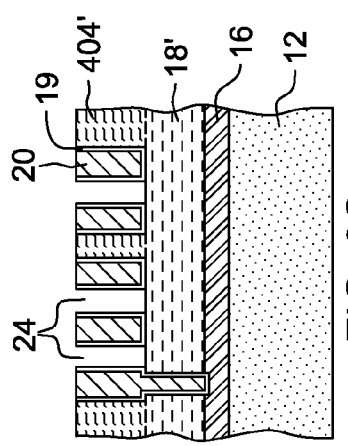

Referring now to FIG. 6D, there is illustrated the structure of FIG. 6C, after forming a dielectric cap 26 atop the cured second PPLK material 404'. As is shown, the dielectric cap 26 seals off the gaps 24 forming air gaps 28 within the structure. The dielectric cap 26 is the same as that mentioned above in the first embodiment of the invention.

Reference is now made to FIGS. 7A-7E which are pictorial representations (through cross sectional view) depicting the basic processing steps employed in a seventh embodiment. The seventh embodiment of the invention can be referred to herein as an under metal gap scheme. The seventh embodiment of the invention begins by first providing the initial structure 600 shown in FIG. 7A. The initial structure 600 includes substrate 12, an ARC 16 and a patterned low k dielectric material 602 that includes a least one via opening 604 therein. An optional dielectric cap can be present between the ARC and the substrate. The substrate 12 and ARC 16 are the same as those described above in the first embodiment of the invention. The patterned low k dielectric material 602 includes any interlevel or intralevel dielectric material including inorganic and organic dielectrics which have a dielectric constant that is less than silicon oxide. The patterned low k dielectric material 602 can be porous or non-porous. Some examples of low k dielectric materials that can be used as dielectric material 602 include, but are not limited to silsequioxanes, C doped oxides (i.e., organosilicates) that includes atoms of Si, C, O and H, thermosetting polyarylene ethers, or multilayered combinations thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. In some embodiments, the patterned low k dielectric material 602 can be a cured PPLK material such as those described herein.

The low k dielectric material used in forming the patterned low k dielectric material 602 can be formed utilizing any conventional deposition process including, for example, CVD, PECVD, evaporation, chemical solution deposition and spin-on coating. The thickness of the low k dielectric material is typically within the ranges mentioned above for PPLK material 18. After depositing the low k dielectric material, convention lithography (including the use of a photoresist) and etching (including one of dry etching or chemical wet etching) are used in forming the at least one via opening 604 therein.

Figure 7A:
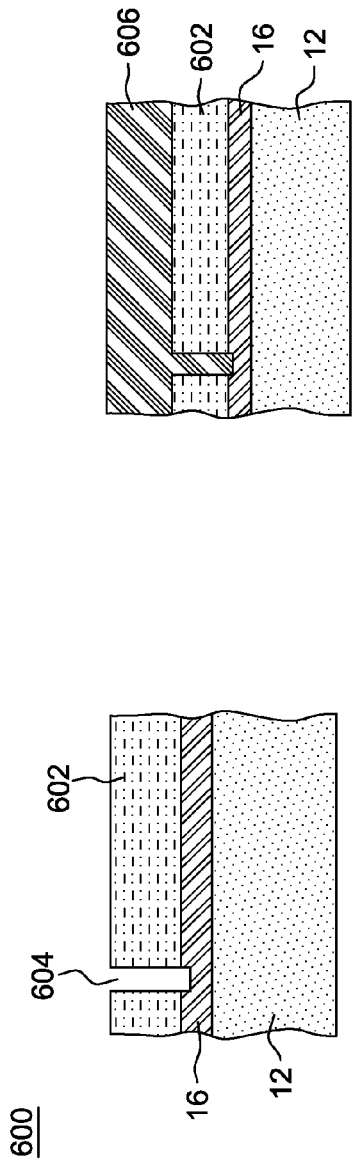
FIGS. 7A-7E are pictorial representations (through cross sectional view) depicting the basic processing steps employed in a seventh embodiment of the invention which can be referred to herein as an under metal gap scheme.
Figure 7B:
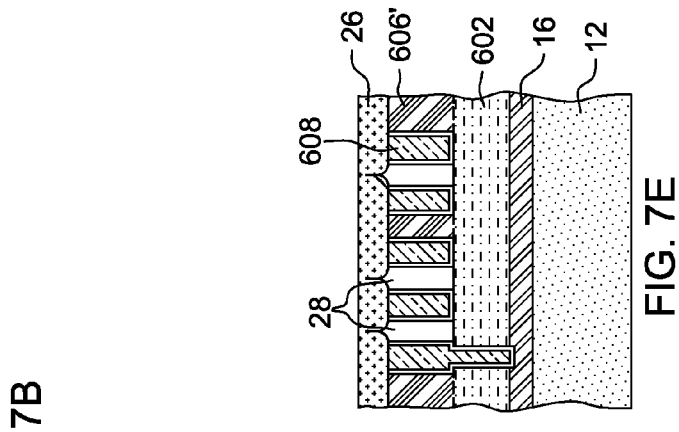

Referring now to FIG. 7B, there is illustrated the structure of FIG. 7A after forming a PPLK material 606 atop the patterned low k dielectric material 602 as well as within the at least one via opening 604. PPLK material 606 which includes one of the PPLK materials mentioned as PPLK material 18, can be formed utilizing one of the deposition techniques mentioned above for forming PPLK material 18.

Figure 7C:
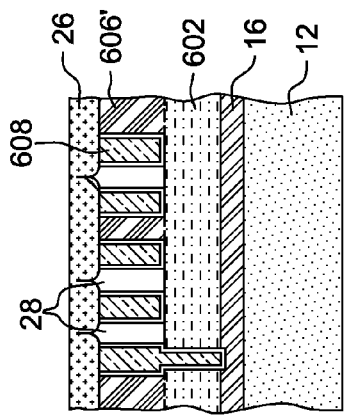

Referring now to FIG. 7C, there is illustrated the structure of FIG. 7B after formation of conductively filled openings 608 including diffusion barrier 19 within the PPLK material 606 and the low k dielectric material 602 and forming gaps 24 within the PPLK material between preselected conductively filled openings 608. The conductively filled openings 608 include one of the conductive metals mentioned above for metal lines 20, and one of the techniques can be used in forming the same. The gaps 24 are formed as described above in the first embodiment of the invention as well. It is noted that during gap formation, the PPLK material 606 is cured into cured PPLK material 606'.

Figure 7D:
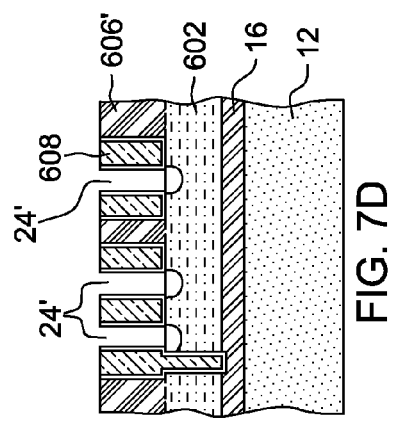

Referring now to FIG. 7D, there is shown the structure of FIG. 7C after performing an isotropic etching process which extends the gaps 24 beneath the conductively filled openings 608. The extended gaps are designated as 24' in FIG. 7D. In one embodiment of the invention, the isotropic etching process can include the use of wet etching, or a combination of plasma induced damage (e.g., $O_2$ plasma, $H_2$ plasma, $NH_3$ plasma, CO plasma, $CO_2$ plasma, $NH_3$, Ar plasma, and a combination thereof) followed by a wet etch process (e.g., HF, diluted HF, vapor HF, KOH, or glycolic acid).

Figure 7E:
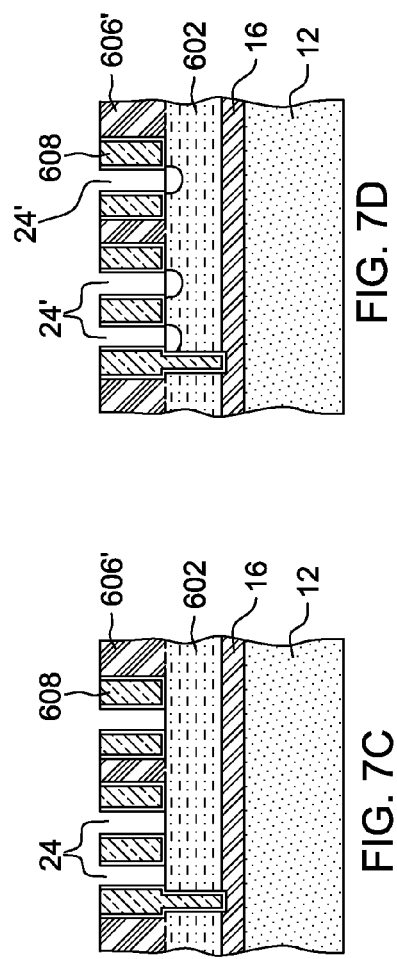

Referring now to FIG. 7E, there is illustrated the structure of FIG. 6C, after forming a dielectric cap 26 atop the cured second PPLK material 606'. As is shown, the dielectric cap 26 seals off the extended gaps 24' forming air gaps 28 within the structure. The dielectric cap 26 is the same as that mentioned above in the first embodiment of the invention.

It is observed that in each of the embodiments described above, an interconnect structure is formed in which an air cap is located within a cured PPLK material between preselected neighboring conductively filled openings. A dielectric cap is located atop the cured PPLK material sealing the air gap.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An interconnect structure comprising:
  a cured photo-patternable low k (PPLK) material located atop a substrate, wherein said cured PPLK material includes a plurality of conductively filled openings located therein;
  at least one air gap located within said cured PPLK material between preselected neighboring conductively filled openings, but not directly beneath said conductively filled openings, wherein a vertical portion of the at least one air gap directly contacts a diffusion barrier layer lining sidewall surfaces of said conductively filled openings and a bottommost surface of said at least one air gap directly contacts a portion of said cured PPLK material; and
  a dielectric cap located atop said cured PPLK material and atop said at least one air gap.

2. The interconnect structure of claim 1, wherein said cured PPLK material is a positive-tone PPLK material.

3. The interconnect structure of claim 1, wherein said cured PPLK material is a negative tone PPLK material.

4. The interconnect structure of claim 1, wherein an anti-reflective coating portion is located between said cured PPLK material and said substrate.

5. The interconnect structure of claim 1, wherein said at least one air gap includes a plurality of air gaps each having a different depth.

6. The interconnect structure of claim 1, wherein said at least one air gap includes a plurality of air gaps each having a same depth.

7. The interconnect structure of claim 1, wherein said at least one air gap extends beneath a lower surface of each of said preselected neighboring conductively filled openings.

8. The interconnect structure of claim 1, wherein said preselected conductively filled line openings include Al, Cu or a mixture thereof.

9. The interconnect structure of claim 1, wherein at least one of said conductively filled openings extends entirely through said cured PPLK material.

10. The interconnect structure of claim 1, wherein said at least one air gap has a bottommost surface that is coplanar with a bottommost surface of said preselected neighboring conductively filled openings.

11. The interconnect structure of claim 1, wherein said dielectric cap comprises a dielectric material selected from at least one of SiC, SiN, $SiO_2$, a carbon doped oxide, and a nitrogen and hydrogen doped silicon carbide SiC(N,H).

12. The interconnect structure of claim 1, wherein said dielectric cap has a graded composition in a vertical direction.

13. The interconnect structure of claim 1, wherein said dielectric cap is a continuous layer.

14. The interconnect structure of claim 1, wherein said dielectric cap comprises CoWP.

15. An interconnect structure comprising:
  a cured photo-patternable low k (PPLK) material located atop a substrate, wherein said cured PPLK material includes a plurality of conductively filled openings located therein;
  at least one air gap located within said cured PPLK material between preselected neighboring conductively filled openings, wherein a vertical portion of the at least one air gap directly contacts a diffusion barrier layer lining sidewall surfaces of said conductively filled openings and a bottommost surface is coplanar with a bottommost surface of said diffusion barrier layer; and
  a dielectric cap located atop said cured PPLK material and atop said at least one air gap.

* * * * *